United States Patent
Nomoto et al.

(10) Patent No.: US 9,283,686 B2
(45) Date of Patent: Mar. 15, 2016

(54) METHOD FOR MANUFACTURING SOLDER COLUMN, APPARATUS FOR MANUFACTURING SOLDER COLUMN, AND SOLDER COLUMN

(75) Inventors: Shinichi Nomoto, Saitama (JP); Takashi Nauchi, Saitama (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 304 days.

(21) Appl. No.: 13/522,947

(22) PCT Filed: Jan. 22, 2010

(86) PCT No.: PCT/JP2010/050849
§ 371 (c)(1),
(2), (4) Date: Jul. 20, 2012

(87) PCT Pub. No.: WO2011/089721
PCT Pub. Date: Jul. 28, 2011

(65) Prior Publication Data
US 2012/0305297 A1    Dec. 6, 2012

(51) Int. Cl.
*B26D 1/06* (2006.01)
*B26D 3/16* (2006.01)
*B23K 35/26* (2006.01)
(Continued)

(52) U.S. Cl.
CPC . *B26D 1/06* (2013.01); *B23K 35/26* (2013.01); *B23K 35/262* (2013.01); *B23K 35/40* (2013.01); *H01L 21/4853* (2013.01); *B26D 3/161* (2013.01); *Y10T 83/0524* (2015.04); *Y10T 83/4577* (2015.04)

(58) Field of Classification Search
CPC ...... B26D 1/06; B26D 2007/013; B26D 5/20; B26D 3/161; B23K 35/0227
USPC ........... 83/255, 942, 942.6; 228/41, 56.3, 170
See application file for complete search history.

(56) References Cited

U.S. PATENT DOCUMENTS 4,596,174 A * 6/1986 LaFleur ........................ 83/153
4,617,849 A * 10/1986 Ligon ............................ 83/18
(Continued)

FOREIGN PATENT DOCUMENTS

CN    1735966    2/2006
EP    1688992    8/2006
(Continued)

OTHER PUBLICATIONS

International Search Report for PCT/JP2010/050849, Apr. 27, 2010.

*Primary Examiner* — Kenneth E. Peterson
*Assistant Examiner* — Samuel A Davies
(74) *Attorney, Agent, or Firm* — Chernoff, Vilhauer, McClung & Stenzel, LLP

(57) ABSTRACT

Solder wires are conveyed from insert openings for allowing the solder wires to be inserted toward discharge openings from which the solder wires are discharged and the solder wires project. The projecting wires are cut with first cutting blades and the solder wires inserted into the insert openings are cut with second cutting blades. This enables fixed cutting stress on a portion of the solder wires to be cut with the first cutting blades and a portion of the solder wires to be cut with the second cutting blades at the same time to prevent deformation of the cut surface of the cut solder wires. Solder columns having a column shape and having a uniform length along a conveying direction thereof can be manufactured.

21 Claims, 11 Drawing Sheets

(51) Int. Cl.
  *B23K 35/40* (2006.01)
  *H01L 21/48* (2006.01)

(56) References Cited

U.S. PATENT DOCUMENTS

| | | | |
|---|---|---|---|
| 5,918,516 A * | 7/1999 | Norell et al. | 83/13 |
| 6,053,394 A * | 4/2000 | Dockerty et al. | 228/180.22 |
| 6,541,710 B1 * | 4/2003 | Deeney et al. | 174/255 |
| 7,185,423 B2 * | 3/2007 | Augustin et al. | 29/832 |
| 7,598,124 B2 * | 10/2009 | Odegard | 438/117 |
| 7,754,343 B2 * | 7/2010 | Love et al. | 428/646 |
| 8,152,048 B2 * | 4/2012 | Zu | 228/245 |
| 2007/0039998 A1 | 2/2007 | Sato et al. | |
| 2008/0086894 A1 * | 4/2008 | Sullivan | 30/155 |

FOREIGN PATENT DOCUMENTS

| | | | | |
|---|---|---|---|---|
| JP | 62-50841 U | | 3/1987 | |
| JP | 02167615 A | * | 6/1990 | B23D 15/00 |
| JP | H06-188355 | | 7/1994 | |
| JP | 11-33779 | | 2/1999 | |
| WO | 2006048931 | | 5/2006 | |

* cited by examiner

| Number | Manufacturing Methods | Manufacturing Errors (± μm) | Side Views | Sectional Views | Wetting Time (sec) |
|---|---|---|---|---|---|
| (1) | The solder columns manufactured by the apparatus 200 of manufacturing the solder columns according to the present invention | 3 | | | 0.1 |
| (2) | The solder columns formed by the disk grindstone | 26 | | | 1.5 |
| (3) | The solder columns formed by the disk type rotary blade | 19 | | | 1.2 |
| (4) | The solder columns formed by the ultrasonic cutter | 7 | | | 0.8 |

| | |
|---|---|
| Inclined Angle: 0°<br>Squareness: 0.020mm or less<br>Evaluation: ○ | |
| Inclined Angle: 5°<br>Squareness: 0.015mm or less<br>Evaluation: ◎ | |
| Inclined Angle: 15°<br>Squareness: 0.038mm<br>Evaluation: ◎ | |
| Inclined Angle: 30°<br>Squareness: 0.064mm<br>Evaluation: × | |

METHOD FOR MANUFACTURING SOLDER COLUMN, APPARATUS FOR MANUFACTURING SOLDER COLUMN, AND SOLDER COLUMN

This is a national stage application filed under 35 USC 371 based on International Application No. PCT/JP2010/050849 filed Jan. 22, 2010.

TECHNICAL FIELD

The present invention relates to a method and an apparatus of manufacturing a solder column, which manufacture the solder column by cutting a solder wire, and the solder column.

BACKGROUND ART

There is a tendency of an increased number of leads in an electronic part to be used in a communication apparatus or an integrated circuit in recent years following rapid communication speed in the communication apparatus or high density of the integrated circuit. Although an electronic part such as quad flat package (QFP) and small outline integrated circuit (SOIC) has existed in the past as an electronic part having the increased number of leads, the past QFP, SOIC and the like are short on the number of leads because any further multifunction has been required in the electronic parts in recent times. A ball grid array (hereinafter referred to as "BGA") such as plastic ball grid array (PBGA), ceramic ball grid array (CBGA) and tape ball grid array (TBGA) has become used as the electronic parts having an increased number of leads.

However, the ceramic ball grid array (hereinafter, referred to as "CBGA") to be used in a super computer or the like is heated when applying voltage thereto so that a ceramic board and a printed circuit board (for example, a glass epoxy board or the like) constituting the corresponding CBGA expand based on this heating. When ceasing applying voltage to CBGA, the ceramic board and the glass epoxy board contract. Thus, the ceramic board and the glass epoxy board repeat to expand and contract by applying voltage to CBGA/ceasing applying the voltage to CBGA.

In general, a thermal expansion coefficient of the ceramic board is 8 ppm/° C. and a thermal expansion coefficient of the glass epoxy board is 15-20 ppm/° C. Therefore, thermal stress occurs in the ceramic board and the glass epoxy board arising from any difference between the thermal expansion coefficient of the ceramic board and thermal expansion coefficient of the glass epoxy board. A ceramic column grid array (hereinafter, referred to as "CGA") in which solder columns having more excellent ability to absorb the thermal stress than that of the solder balls have been used has become used in place of CBGA in recent years.

In the solder columns used in the CGA, linear high-temperature solder that is predominantly composed of lead (Pb), metal line, solder-plating metal line and the like are used. Although, as shapes of the solder columns, there are various kinds thereof following a scale of CGA and numbers of leads, the column-shaped one having a diameter of 0.5 mm and a length of 2.54 mm has been often used. It is necessary for such CGA to mount each of the solder columns at right angles to the ceramic board, in order to enable the solder columns to sufficiently exhibit its ability to absorb the thermal stress.

The following will describe a popular method of forming CGA. Though not shown, first, solder paste is pasted on electrode portions of the ceramic board. Next, a mounting jig for mounting the solder columns at right angles to the corresponding electrode portions is put on the ceramic board. The solder columns are then passed through the through-holes perforated in the mounting jig so that the solder columns stand in the solder paste on the electrode portions. This is inserted into heating device such as a reflow furnace while such a condition being kept, which heats this under a desired temperature condition. As a result thereof, the solder paste pasted on the electrode portions of the ceramic board is melted so that the ceramic board and the solder columns are soldered to each other, thereby forming CGA.

As other methods of mounting the solder columns at right angles to the ceramic board, there are, for example, a method in which the solder columns are mounted using an alignment jig for aligning them in a row as disclosed in Japanese Patent Application Publication No. 2004-221287 and a method in which the solder columns are suctioned directly to a suction head so as to be aligned and the aligned solder columns are mounted on the ceramic board as disclosed in the publication WO2006/48931. Thus, if a shape of each of the solder columns lacks precision, the solder columns cannot be aligned by the alignment jig or they are caught in the alignment jig while aligning them using the alignment jig so that solder columns cannot be mounted. Therefore, the solder columns to be mounted on CGA are required to become the solder columns formed as column shapes, which have a good shape precision and an equal length.

In order to install CGA on the glass epoxy board, first, solder paste is pasted on electrode portions of the glass epoxy board. Next, the solder columns of CGA are mounted on the corresponding electrode portions and then, are heated in heating device such as a reflow furnace. As a result thereof, the solder paste is melted so that the solder columns and the glass epoxy board are soldered to each other, thereby installing CGA on the glass epoxy board.

In such a way, in order to set the solder columns between the ceramic board and the glass epoxy board, the heating twice in the reflow furnace is required. Therefore, the high-temperature solder is used as solder alloy to be used in the solder columns of CGA so that it cannot be melted by the heating twice in the reflow furnace and the heating from IC chip mounted in a super computer or the like.

Further, since the solder columns join the ceramic board and the glass epoxy board, a crack or a breakage may occur in any of the solder columns because of thermal stress if the solder columns are too hard.

Therefore, the high-temperature solder to be used in the solder columns has a Pb based composition such as 95Pb-5Sn and 89.5Pb-10.5Sn. Such Pb based high-temperature solder is softer than that of other metal material and its Mohs hardness is a range of 1.5 through 2.0.

A method of manufacturing the solder column in which linear solder is used and this solder is cut to a desired length is popular. Patent document 1 discloses that after an end of every solder column is soldered to the ceramic board, the other end of the solder column is cut by a knife, a razor or the like so that the solder columns are aligned in height.

PRIOR ART DOCUMENTS

Patent Document

Patent Document 1: Japanese Patent Application Publication No. H06-188355

DISCLOSURE OF THE INVENTION

Problems to be solved by the Invention

According to the method of cutting the solder columns disclosed in the patent document 1, however, a cut surface thereof is broken so as to fail to become column shape because Pb based high-temperature solder is soft. As other examples, further, there are methods of cutting the high-temperature solder by a rotary cutter, an ultrasonic cutter and the like but according to these methods, heat is generated at a cut portion of the solder wire so that a cut surface of the solder column is broken so as to fail to become column shape. According to a method of grinding the high-temperature solder by means of a grindstone or the like after it has been cut, a ground surface thereof swells out so that a burr occurs so as to fail to become column shape.

Thus, if a cut surface of the solder column is broken so as to fail to become column shape, it is difficult to align the solder columns with the above-mentioned alignment jig for the solder columns or the suction head and transfer the solder columns.

The invention, then, solves such problems relating to the conventional examples, and has an object to provide a method and an apparatus of manufacturing solder column, and the solder column, which prevents the cut surface of the Pb based high-temperature solder such as 95Pb-5Sn and 89.5Pb-10.5Sn, which is difficult to be processed, from being deformed, thereby enabling the solder columns to have a same length.

Means for Solving the Problems

Inventors have found out that by cutting the solder wire composed of the Pb-based high-temperature solder back and forth in the longitudinal direction thereof at the same time, fixed stress for cutting exerts on a front portion and a rear portion of the solder wire to be cut at the same time so that the deformation of the cut surface thereof is limited and have completed this invention.

In order to solve the above-mentioned problems, the method of manufacturing the solder column according to the invention is characterized in that it comprises a first step of conveying a solder wire from an insert opening for allowing the solder wire to be inserted toward a discharge opening from which the solder wire inserted into the insert opening is discharged and projecting the solder wire from the discharge opening, and a second step of cutting the solder wire projected from the discharge opening with a first cutting blade and cutting the solder wire inserted into the insert opening with a second cutting blade.

In the method of manufacturing the solder column according to the invention, a solder wire is conveyed from the insert opening for allowing the solder wire to be inserted toward the discharge opening from which the solder wire inserted into the insert opening is discharged and this solder wire is projected from the discharge opening. The solder wire projected from the discharge opening is then cut with the first cutting blade and the solder wire inserted into the insert opening is cut with the second cutting blade. For example, the solder wire projected from the discharge opening and the solder wire inserted into the insert opening are cut at the same time with the first and second cutting blades.

Thus, fixed stress for cutting exerts on a portion of the solder wire to be cut with the first cutting blade and a portion of the solder wire to be cut with the second cutting blade at the same time so that the deformation of the cut surface of the solder wire can be prevented.

The apparatus of manufacturing the solder column according to the invention is characterized in that it comprises a main body portion having an insert opening for allowing a solder wire to be inserted and a discharge opening from which the solder wire inserted into the insert opening is discharged, a conveying mechanism that conveys the solder wire from the insert opening toward the discharge opening, a first cutting blade that cuts the solder wire projecting from the discharge opening, the first cutting blade being provided near the discharge opening, a second cutting blade that cutting the solder wire inserted into the insert opening, the second cutting blade being provided near the insert opening, and a controlling portion that causes the solder wire to be projected from the discharge opening by the conveying mechanism, causes the projected solder wire to be cut with the first cutting blade and causes the solder wire inserted into the insert opening to be cut with a second cutting blade.

In the apparatus of manufacturing the solder column according to the invention, fixed stress for cutting exerts on a portion of the solder wire to be cut with the first cutting blade and a portion of the solder wire to be cut with the second cutting blade at the same time so that the deformation of the cut surface of the solder wire can be prevented.

The solder column according to the invention is a solder column having a column shape and connecting a ceramic board and a glass epoxy board, characterized in that plural one-directional processed lines exist in a cut surface.

In the solder column according to the invention, plural one-directional processed lines exist in the cut surface so that stress from outside spreads so as to increase an intensity of each solder column substantially. Further, oxide film formed on a portion of a surface of the solder column in which the processed lines exist is thin so that wettability to solder paste is improved.

Further, the solder column according to the invention is characterized in that by conveying a solder wire from an insert opening for allowing the solder wire to be inserted toward a discharge opening from which the solder wire inserted into the insert opening is discharged, projecting the solder wire from the discharge opening, cutting the solder wire projected from the discharge opening with a first cutting blade and cutting the solder wire inserted into the insert opening with a second cutting blade, processed lines are formed.

In the solder column according to the invention, the processed lines are formed with fixed stress for cutting exerting on a portion of the solder wire to be cut with the first cutting blade and a portion of the solder wire to be cut with the second cutting blade at the same time so that the deformation of the cut surface of the solder wire can be prevented.

Effects of the Invention

By the method and the apparatus of manufacturing the solder column according to the present invention, it is possible to cut the solder wire so as to enable the deformation of the cut surface thereof to be prevented, so that the solder columns each having the column shape and the fixed length in a conveying direction can be manufactured.

Further, by the solder column according to the present invention, the cut surface thereof is not deformed so that it has a column shape having a fixed length in the conveying direction, thereby enabling the shape precision to be improved. The cut surface also has a smooth surface and a metallic luster and forms plural one-directional processed lines so that the wettability to solder paste is improved, thereby improving reliability in CGA.

BRIEF DESCRIPTION OF THE DRAWINGS

FIG. 16 is a table showing solder columns manufactured by each of four different methods, showing the magnitude of manufacturing errors, together with photographic views of solder columns manufactured in accordance with the tabulated methods and the wetting times for each of the solder columns illustrated.

FIG. 17 is a table showing solder columns manufactured by cutting solder wires using blades of single edge cutters fixed at each of four different angles using a first apparatus disclosed herein, including photographs of the resulting solder columns and showing the squareness of each solder column.

BEST MODE FOR CARRYING OUT THE INVENTION

The following will describe an apparatus of manufacturing solder columns as one example of embodiments according to the present invention with reference to drawings.

First Embodiment

Configuration Example of Apparatus 100 of Manufacturing Solder Columns

Figure 1:
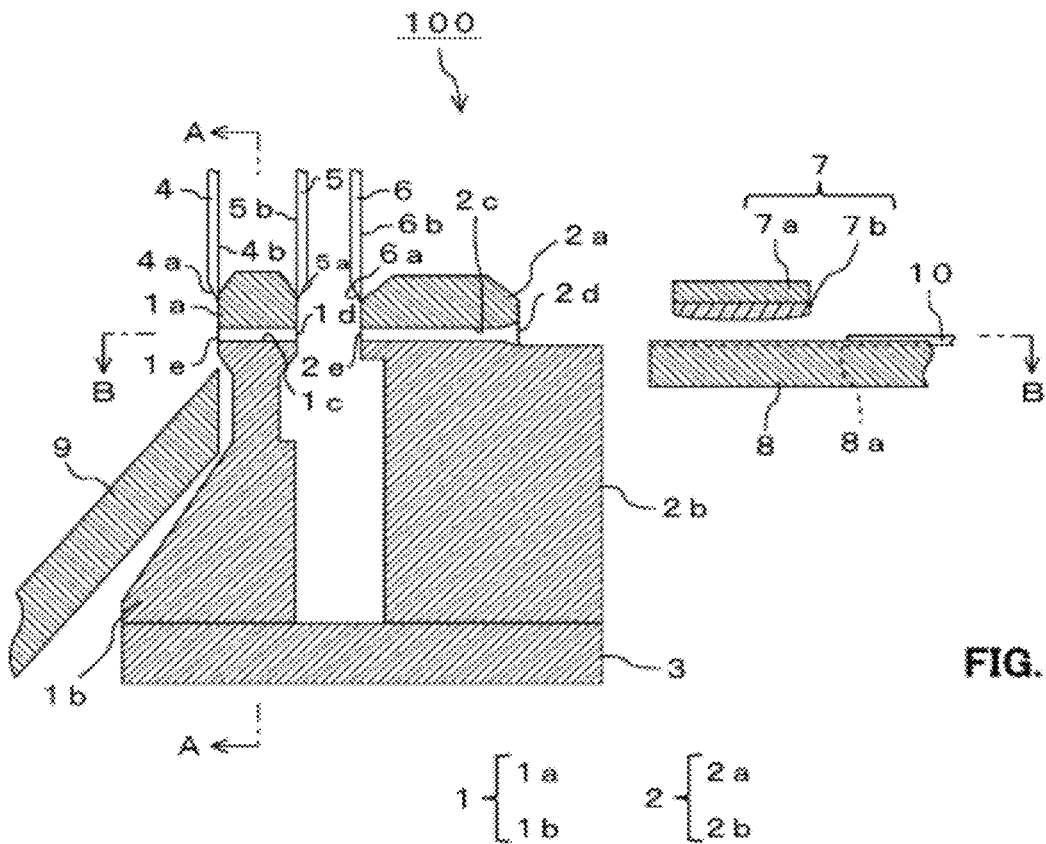
FIG. 1 is a sectional view of an apparatus 100 of manufacturing solder columns as a first embodiment for showing a configuration example thereof.
Figure 2:
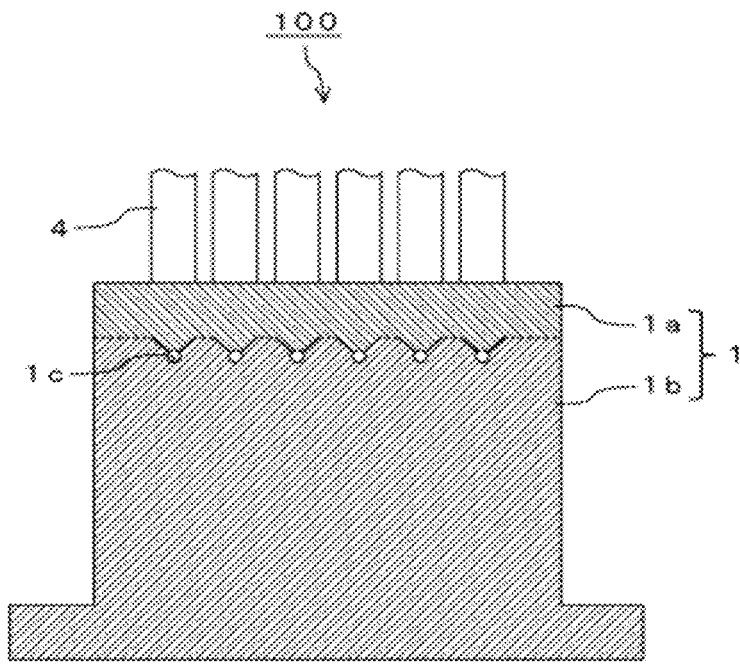
FIG. 2 is a sectional view of the apparatus 100 of manufacturing solder columns, taken along lines A-A, for showing a configuration example thereof.
Figure 3:
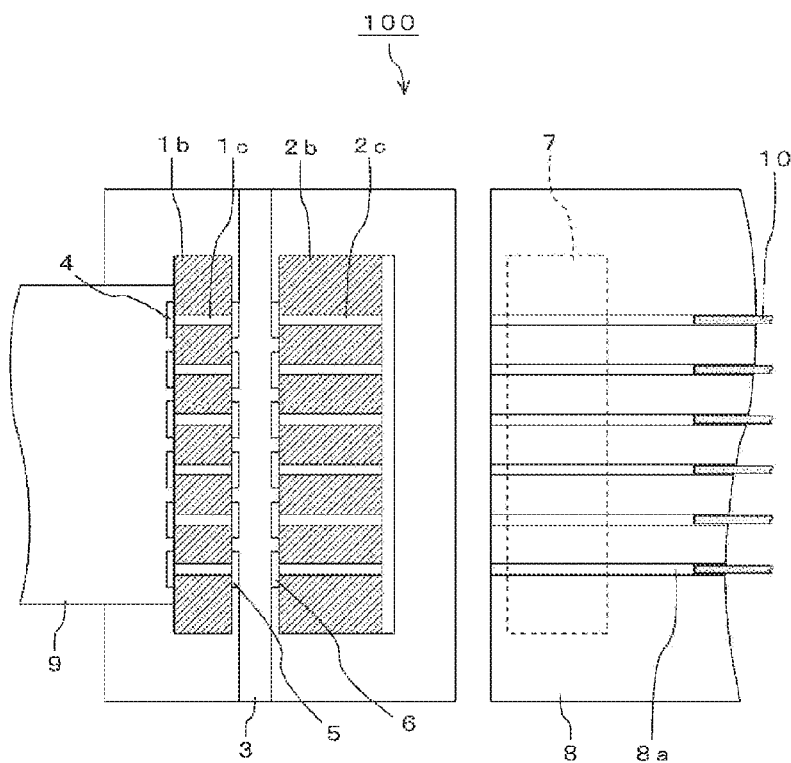
FIG. 3 is a sectional view of the apparatus 100 of manufacturing solder columns, taken along lines B-B, for showing a configuration example thereof.

As shown in FIGS. 1 through 3, the apparatus 100 of manufacturing solder columns is constituted of a main body section 1, first cutting blades 4, second cutting blades 5, an attaching section 7 and a solder-wire-conveying section 8. The apparatus 100 of manufacturing solder columns is also provided with a solder-wire-guiding section 2, a main-body-supporting section 3, third cutting blades 6 and a solder-collecting section 9. By the way, the attaching section 7 and the solder-wire-conveying section 8 constitute conveying mechanism of the present invention.

The main body section 1 is provided with an upper mold 1a of the main body section and a lower mold 1b of the main body section. As shown in FIG. 2, grooves are provided in the upper mold 1a of the main body section and the lower mold 1b of the main body section and when the upper mold 1a of the main body section and the lower mold 1b of the main body section are fitted, conveying paths 1c in which wired solders (hereinafter, referred to as "solder wires 10") composed of Pb based high-temperature solder (for example, a solder including 95 (% by mass) Pb and 5 (% by mass) Sn and a solder including 89.5 (% by mass) Pb and 10.5 (% by mass) Sn (hereinafter referred to as "95Pb-5Sn and 89.5Pb-10.5Sn) are conveyed are provided between the upper mold 1a of the main body section and the lower mold 1b of the main body section. A diameter of each conveying path 1c is made larger than a diameter of each solider wire 10 so that the solder wires 10 can be moved smoothly in the conveying paths 1c. Namely, the upper mold 1a of the main body section and the lower mold 1b of the main body section have function to keep the solder wires 10 at predetermined positions without applying any pressure thereto (if pressure more than the predetermined value is applied to the solder wires, they are deformed.) A length of each conveying path 1c is almost the same as the length of the solder column. For example, when manufacturing the solder columns each having a length of 2.54 mm, the length of each conveying path 1c is set so as to be 2.54 mm. In this embodiment, 6 conveying paths 1c are provided so that it is possible to manufacture 6 solder columns at the same time. Number of the conveying paths 1c may be suitably changed.

An insert opening 1d is provided at an end of each conveying path 1c and a discharge opening 1e is provided at the other end of each conveying path 1c. The insert opening 1d is an opening allowing the solder wire 10 guided by the solder-wire-guiding section 2 to be inserted into the main body section 1. The discharge opening 1e is an opening from which the solder wire 10 inserted into the insert opening 1d is discharged out of the main body section 1.

The solder-wire-guiding section 2 is arranged in parallel with the main body section 1. The solder-wire-guiding section 2 is used for guiding the solder wires 10 to the main body section 1. The solder-wire-guiding section 2 is provided with an upper mold 2a of the guiding section and a lower mold 2b of the guiding section. Grooves like those in the upper mold 1a of the main body section and the lower mold 1b of the main body section are provided in the upper mold 2a of the guiding section and the lower mold 2b of the guiding section and when the upper mold 2a of the guiding section and the lower mold 2b of the guiding section are fitted, guiding paths 2c are provided between the upper mold 2a of the guiding section and the lower mold 2b of the guiding section. A diameter of each guiding path 2c is larger than the diameter of each solder wire 10 and the guiding paths 2c guide the solder wires 10 to the main body section 1.

An insert opening 2d is provided at an end of each guiding path 2c and the discharge opening 2e is provided at the other end of each guiding path 2c. The insert opening 2d is an opening allowing the solder wire 10 conveyed by the attaching section 7 and the solder-wire-conveying section 8 to be inserted into the solder-wire-guiding section 2. The discharge opening 2e is an opening from which the solder wire 10 inserted into the insert opening 2d is discharged out of the solder-wire-guiding section 2.

The main-body-supporting section 3 is provided at a lower part of the main body section 1 and the solder-wire-guiding section 2. The main-body-supporting section 3 is a support of the main body section 1 and the solder-wire-guiding section 2, which supports the main body section 1 and the solder-wire-guiding section 2.

The first cutting blades 4 are provided near the discharge openings 1e of the main body section 1 (in FIG. 1, above the discharge openings 1e). The first cutting blades 4 cut the solder wires 10 projecting from the discharge openings 1e. Further, the second cutting blades 5 are provided near the insert openings 1d of the main body section 1 (in FIG. 1, above the insert openings 1d). The second cutting blades 5 cut the solder wires 10 inserted into the insert openings 1d. The cut surfaces of the solder wires 10 cut with the first cutting blades 4 and the second cutting blades 5 are not deformed, thereby forming the almost vertical cut surfaces.

The third cutting blades 6 are provided near the discharge openings 2e of the solder-wire-guiding section 2 (in FIG. 1, above the discharge openings 2e). The third cutting blades 6 cut the solder wires 10 discharged from the discharge openings 2e. The cut surfaces of the solder wires 10 cut with the third cutting blades 6 are not deformed, thereby forming the almost vertical cut surfaces.

The first through third cutting blades 4, 5, 6 have inclined surfaces 4a, 5a, and 6a each being inclined in relation to a direction in which each blade extends and parallel surfaces 4b, 5b, 6b each being in parallel with the direction in which each blade extends. As the first through third cutting blades 4, 5, 6, single edge blades each, for example, being made of iron or ceramics are used. A thickness of each of the first through third cutting blades 4, 5, 6 is 0.3 mm through 0.6 mm.

Each first cutting blade 4 cuts the solder wire 10 discharged from the discharge opening 1e by moving (sliding) the parallel surface 4b of the first cutting blade 4 so as to be in contact against the main body section 1 from top of the discharge opening 1e to bottom thereof. Each second cutting blade 5 cuts the solder wire 10 inserted into the insert opening 1d by moving (sliding) the parallel surface 5b of the second cutting blade 5 so as to be in contact against the main body section 1 from top of the insert opening 1d to bottom thereof. For example, by moving the first cutting blades 4 and the second cutting blades 5 downwards at the same time, the solder wires 10 discharged from the discharge openings 1e and the solder wires 10 inserted into the insert openings 1d are cut.

Thus, even by cutting the solder wires 10 at the same time with the first and second cutting blades 4, 5, the solder wires 10 stay unmoved within the conveying paths 1c so that the cut surfaces of the solder wires are not deformed so as to be almost vertical in relation to a conveying direction of the corresponding solder wires 10. As the result thereof, it is possible to manufacture the solder columns each of which has a fixed, varied little length (height) in relation to the conveying direction thereof.

By the way, if the solder wires are cut by moving the inclined surfaces 4a, 5a, not the parallel surfaces 4b, 5b, so as to be in contact against the main body section 1 or if the solder wires 10 are cut with the cutting blades having double edge blades, not single edge blades, any space occurs between each cutting blade and the main body section 1 so that the cut surfaces of the solder wires 10 are deformed not so as to be vertical in relation to the conveying direction of the corresponding solder wires 10. Variation in shapes of the solder columns occurs. Further, if the solder wires 10 are cut with the first cutting blades 4 and then, the first cutting blades 4 are moved upwards above the discharge openings 1e, thereafter the solder wires 10 are cut with the second cutting blades 5, unless the solder wires 10 are cut with the first and second cutting blades 4, 5 at the same time, the solder wires 10 are cut not so as to remain within the main body section 1 (while moving toward the discharge openings 1e) so that the cut surfaces of the solder wires 10 are deformed. Therefore, it is preferable that the solder wires 10 are cut at the same time while the parallel surfaces 4b, 5b being in contact against the main body section 1.

The third cutting blades 6 cut the solder wires 10 discharged from the discharge openings 1e by moving (sliding) the parallel surfaces 6b of the third cutting blades 6 from tops of the discharge openings 1e to bottoms thereof so as to be in contact against the solder-wire-guiding section 2.

Thus, when cutting the solder wires 10 with the third cutting blades 6, the cut surfaces of the solder wires 10 are almost vertical in relation to the conveying direction of the corresponding solder wires 10 so that it is possible to insert the solder wires 10 easily to the insert openings 1d of the main body section 1.

By the way, if the solder wires are cut by moving the inclined surfaces 6a, not the parallel surfaces 6b, so as to be in contact against the solder-wire-guiding section 2, any space occurs between each cutting blade and the solder-wire-guiding section 2 so that the cut surfaces of the solder wires 10 are deformed not so as to be vertical in relation to the conveying direction of the corresponding solder wires 10. Therefore, it is necessary that the solder wires 10 are cut while the inclined surfaces 6a are in contact against the solder-wire-guiding section 2. Unless the solder wires are previously cut with the third cutting blades 6, it is necessary that the solder wires, the cut surfaces of which are deformed and pushed downwards to be curved, cut with the inclined surfaces 5a of the second cutting blades 5 have to be inserted into the insert openings 1d. It is impossible to insert the corresponding solder wires into the insert openings 1d.

The moving mechanism composed of the attaching section 7 and the solder-wire-conveying section 8 conveys the solder wires 10 in a direction of the solder-wire-guiding section 2. For example, by allowing the attaching section 7 to move to upward and downward directions and left and right directions and allowing the solder-wire-conveying section 8 to move to left and right directions, grooves 8a provided in the solder-wire-conveying section 8 and the attaching section 7 hold the solder wires 10 therebetween and convey the held solder wires 10 to the direction of the solder-wire-guiding section 2.

The attaching section 7 has an upper portion 7a of the attaching section and a lower portion 7b of the attaching section. The upper portion 7a of the attaching section is made of metallic materials such as stainless and the lower portion 7b of the attaching section is made of resin materials such as urethane resin or fluororesin. By making the lower portion 7b of the attaching section of the resin materials, it is capable of preventing the solder wires 10 from being damaged even if the attaching section 7 and the solder-wire-conveying section 8 hold the solder wires 10 therebetween.

The solder-collecting section 9 is provided under the discharge openings 1e of the main body section 1. For example, the solder-collecting section 9 collects cut solder pieces 10b shown in FIG. 7, which will be described later, and the solder columns 11 formed by simultaneous cutting with the first and second cutting blades 4, 5. The solder-collecting section 9 is provided with a riddle, not shown, which separates the cut solder pieces 10b and the solder columns 11, which have been collected by the solder-collecting section 9, from each other.

[Configuration Example of Control System of Apparatus 100 of Manufacturing Solder Columns]

Figure 4:
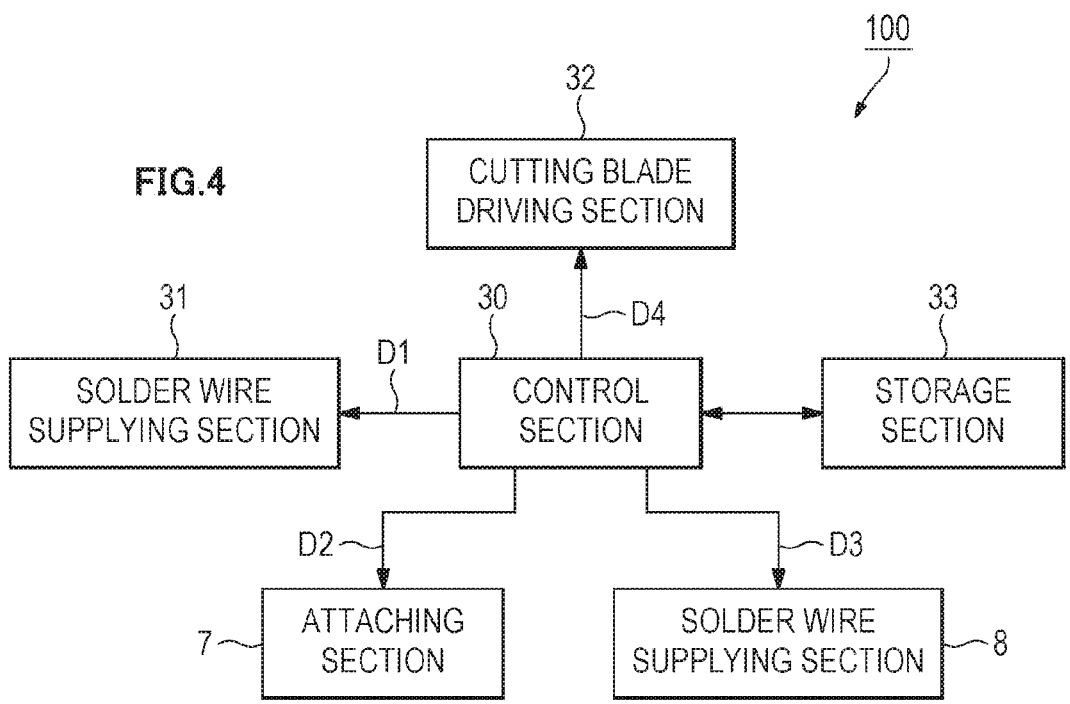
FIG. 4 is a block diagram showing a configuration example of a control system in the apparatus 100 of manufacturing solder columns.

The following will describe a configuration example of the control system of the apparatus 100 of manufacturing the solder columns. As shown in FIG. 4, the control system of the apparatus 100 of manufacturing the solder columns is constituted by a control section 30, the attaching section 7, the solder-wire-conveying section 8, a solder-wire-supplying section 31, a cutting-blade-driving section 32 and a storage section 33.

The control section 30 controls the attaching section 7, the solder-wire-conveying section 8, the solder-wire-supplying section 31 and the cutting-blade-driving section 32. The control section 30 reads out of the storage section 33, for example, a start-up program for the apparatus 100 of manufacturing the solder columns and causes the attaching section 7, the solder-wire-conveying section 8, the solder-wire-supplying section 31 and the cutting-blade-driving section 32 to be driven based on the read start-up program.

The control section 30 outputs a solder-supplying signal D1 to the solder-wire-supplying section 31. The solder-wire-supplying section 31 then receives the solder-supplying signal D1 to supply the solder wires 10 to the grooves 8a of the solder-wire-conveying section 8. The solder-wire-supplying section 31 is constituted by, for example, a motor, not shown, a spool mounted on the motor and the like and supplies the solder wires 10, which have been wound on the spool, to the grooves 8a by driving the motor based on the solder-supplying signal D1 output from the control section 30.

The control section 30 also outputs an attaching-section-driving signal D2 to the attaching section 7 and outputs a solder-conveying signal D3 to the solder-wire-conveying section 8. The attaching section 7 and the solder-wire-conveying section 8 receive the attaching-section-driving signal D2 and the solder-conveying signal D3, which have been output from the control section 30, to convey the solder wires 10 to the solder-wire-guiding section 2.

For example, the control section 30 causes the solder wires 10 to be held between the attaching section 7 and the solder-wire-conveying section 8 by attaching the attaching section 7 to the solder wires 10 rest and placed on the grooves 8a of the solder-wire-conveying section 8 from above. The control section 30 also causes the solder wires 10 to be inserted into the solder-wire-guiding section 2 by moving the solder-wire-conveying section 8 to the direction of the solder-wire-guiding section 2 (in FIG. 1, to left side).

Further, the control section 30 outputs a cutting-blade-driving signal D4 to the cutting-blade-driving section 32. The cutting-blade-driving section 32 receives the cutting-blade-driving signal D4, which has been output from the control section 30 and moves the first through third cutting blades 4, 5, 6, which are connected to the cutting-blade-driving section 32, in their up and down directions. The cutting-blade-driving section 32 is provided for each of the first through third cutting blades 4, 5, 6 and drives the respective first through third cutting blades 4, 5, 6 independently.

For example, the cutting-blade-driving section 32 moves the first and second cutting blades 4, 5 concurrently in their up and down directions. By moving the first and second cutting blades 4, 5 concurrently in their up and down directions, it is possible to cut the solder wires 10 discharged from the discharge openings 1e and the solder wires 10 inserted into the insert opening 1d at the same time.

Thus, fixed stress for cutting exerts on a portion of each solder wire 10 to be cut with each first cutting blade 4 and a portion of each solder wire 10 to be cut with each second cutting blade 5 at the same time so that the deformation of the cut surfaces of the cut solder wires 10 can be prevented. As a result thereof, it is possible to manufacture the solder columns each having a fixed length in the conveying direction thereof.

It is to be noted that the third cutting blades 6 may be moved in their up and down directions simultaneously with the first and second cutting blades 4, 5 to cut the solder wires 10 or they may be moved in their up and down directions after the first and second cutting blades 4, 5 have been moved, to cut the solder wires 10.

[Operation Example of Apparatus 100 of Manufacturing Solder Columns]

The following will describe an operation example of the apparatus 100 of manufacturing the solder columns. It is assumed that from the control section 30, the solder-supplying signal D1 is output to the solder-wire-supplying section 31 and the solder wires 10 are supplied to the grooves 8a.

Figure 5:
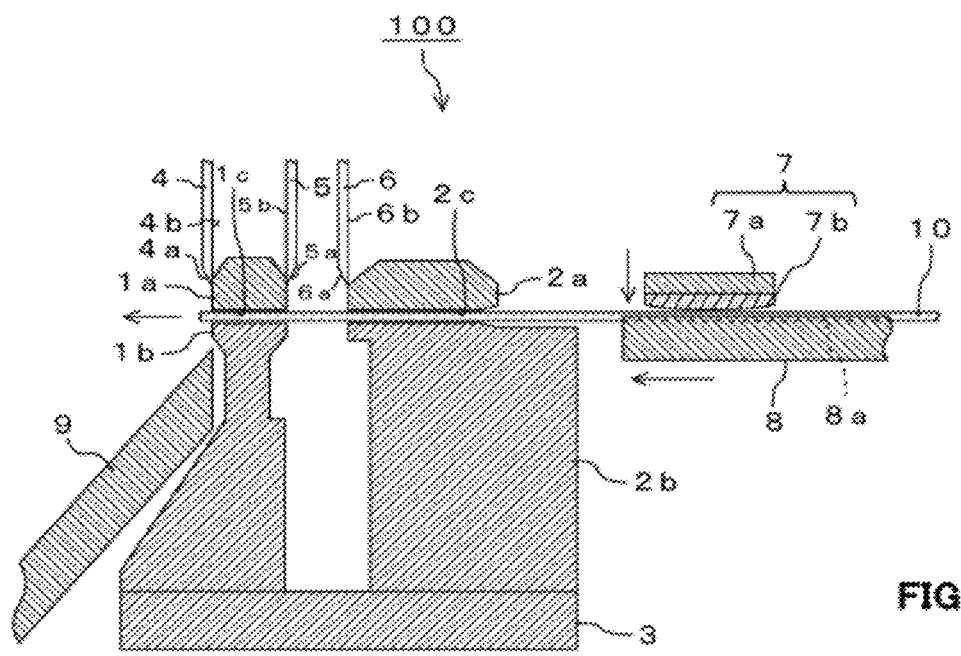
FIG. 5 is a sectional view of the apparatus 100 of manufacturing solder columns for showing an operation example (part one) thereof.

When the control section 30 shown in FIG. 4 outputs the attaching-section-driving signal D2 to the attaching section 7, the attaching section 7 receives the attaching-section-driving signal D2 and descends to the solder wires 10 mounted on the grooves 8a of the solder-wire-conveying section 8, as shown in FIG. 5, to attach the solder wires 10. When the control section 30 also outputs the solder-conveying signal D3 to the solder-wire-conveying section 8, the solder-wire-conveying section 8 receives the solder-conveying signal D3 and moves by a predetermined distance in a conveying direction of the solder wires 10 (in FIG. 5, it moves to left side) after the attaching section 7 has attached the solder wires 10 so as to be passed through guiding paths 2c and the conveying paths 1c. At that, each solder wire 10 projects by a predetermined length from the discharge opening 1e.

This predetermined length may be suitably changed on the basis of a diameter of each solder wire 10 and/or a length of each solder column to be manufactured. For example, when the diameter of each solder wire 10 is 0.5 mm and the length of each solder column is 2.54 mm, it projects by about 1 to 2 mm from the discharge opening 1e.

Figure 6:
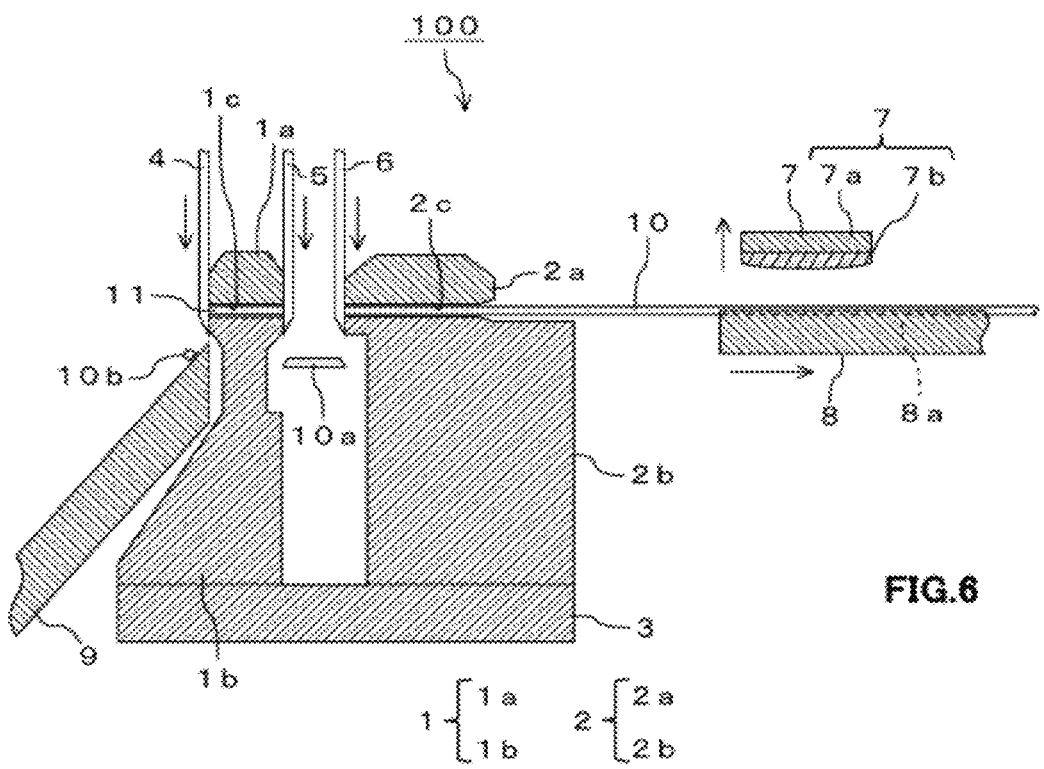
FIG. 6 is a sectional view of the apparatus 100 of manufacturing solder columns for showing the operation example (part two) thereof.

When projecting the solder wires 10 from the discharge openings 1e by the predetermined length by the attaching section 7 and the solder-wire-conveying section 8 as shown in FIG. 6, the control section 30 outputs the cutting-blade-driving signal D4 to the cutting-blade-driving section 32. At that, the cutting-blade-driving section 32 receives the cutting-blade-driving signal D4 to drive the first cutting blades 4, connected to the cutting-blade-driving section 32, which cut the solder wires 10 projected from the discharge openings 1e and to drive the second cutting blades 5, connected to the cutting-blade-driving section 32, which cut the solder wires 10 inserted into the insert openings 1d. The cutting-blade-driving section 32 also drives the third cutting blades 6, connected to the cutting-blade-driving section 32, which cut the solder wires 10 discharged from the discharge openings 2e.

When cutting them, any repulsive force (the repulsive force in response to the first and second cutting blades 4, 5) exerts on the solder wires 10, which are cut by the first and second cutting blades 4, 5, within the conveying paths 1c in directions directed toward outside of the main body section 1 from the discharge openings 1e and the insert openings 1d. Thus, although the solder wires 10 within the conveying paths 1c tend to be deformed on the basis of this repulsive force, they are not deformed because the first and second cutting blades 4, 5 close the discharge openings 1e and the insert openings 1d.

In specific terms, by moving the first cutting blades 4 from a position above the discharge openings 1e to a position below them (from the upper mold 1a of the main body section to the lower mold 1b of the main body section) while the parallel surfaces 4b of the first cutting blades 4 attach the main body section 1 at a side of the discharge openings 1e, the solder wires 10 projected from the discharge openings 1e by the predetermined length are cut. Concurrently, by moving the second cutting blades 5 from a position above the insert openings 1d to a position below them (from the upper mold 1a of the main body section to the lower mold 1b of the main body section) while the parallel surfaces 5b of the second cutting blades 5 attach the main body section 1 at a side of the insert openings 1d, the solder wires 10 inserted into the insert openings 1d are cut. Further, by moving the third cutting blades 6 from a position above the discharge openings 2e to a position below them (from the upper mold 2a of the guiding section to the lower mold 2b of the guiding section) while the parallel surfaces 6b of the third cutting blades 6 attach the solder-wire-guiding section 2 at a side of the discharge openings 2e, the solder wires 10 conveyed from the discharge openings 2e are cut.

At that, the solder wires 10, which are projected from the discharge openings 1e, cut with the first cutting blades 4 become cut solder pieces 10b so that they are collected by the solder-collecting section 9. The solder wires 10 cut with the second cutting blades 5 and the third cutting blades 6 become cut solder pieces 10a so that they are collected by a second solder-collecting section, not shown. Within the conveying paths 1c between the insert openings 1d and the discharge openings 1e, the solder columns 11 each having a length of the conveying paths 1c then remain.

The control section 30 outputs the attaching-section-driving signal D2 and the solder-conveying signal D3 to the attaching section 7 and the solder-wire-conveying section 8 after the solder wires 10 have been cut (after the solder columns 11 have been formed). At that, the attaching section 7 receives the attaching-section-driving signal D2 to ascend and the solder-wire-conveying section 8 receives the solder-conveying signal D3 to move (in FIG. 6, to move to right side) by a distance to convey the solder wires 10 to the discharge openings 1e (for example, the total sum of a distance between the discharge openings 2e and the insert openings 1d, a distance between the insert openings 1d and the discharge openings 1e and an amount of projection of the solder wires 10 to be projected from the discharge openings 1e).

Figure 7:
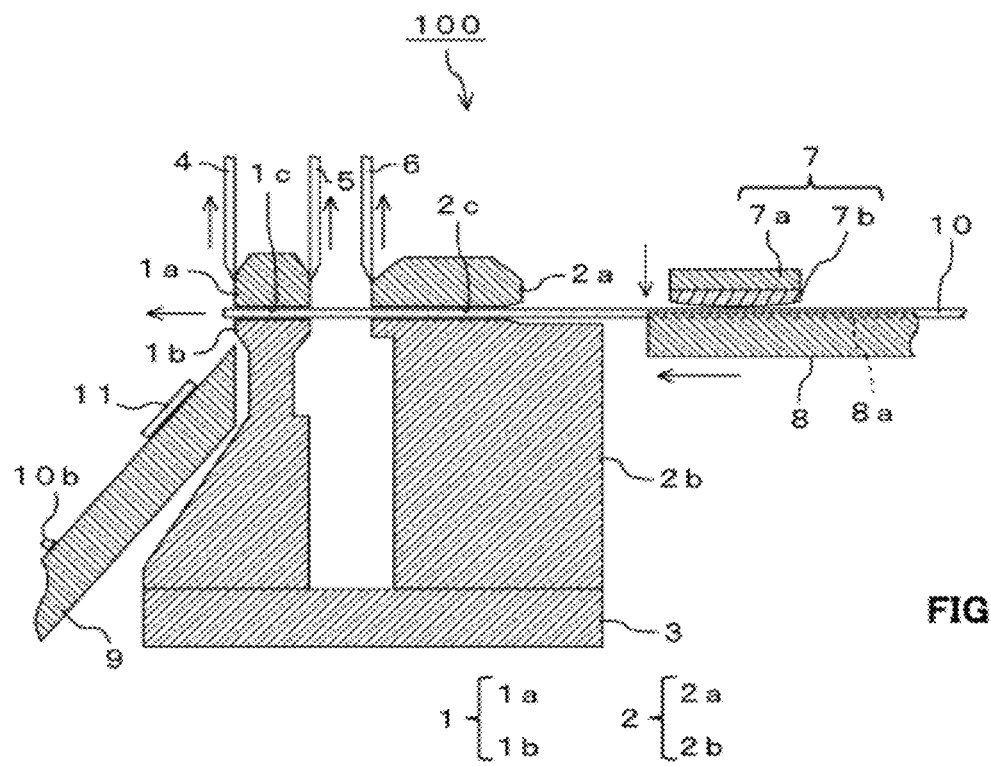
FIG. 7 is a sectional view of the apparatus 100 of manufacturing solder columns for showing the operation example (part three) thereof.

The control section 30 outputs the cutting-blade-driving signal D4 to the cutting-blade-driving section 32 after the attaching section 7 has ascended and the solder-wire-conveying section 8 moves to right side. Thus, as shown in FIG. 7, the cutting-blade-driving section 32 moves the first through third cutting blades 4, 5, 6 above the discharge openings 1e, the insert openings 1d and the discharge openings 2e based on the cutting-blade-driving signal D4 output from the control section 30.

The control section 30 then outputs the attaching-section-driving signal D2 and the solder-conveying signal D3 to the attaching section 7 and the solder-wire-conveying section 8. The attaching section 7 receives the attaching-section-driving signal D2 output from the control section 30 to descend to the solder wires 10 mounted on the grooves 8a and to attach the solder wires 10. The solder-wire-conveying section 8 receives the solder-conveying signal D3 output from the control section 30 to move toward the solder-wire-guiding section 2. This movement of the solder-wire-conveying section 8 causes tips of the solder wires 10 cut with the third cutting blades 6 to be inserted into the insert openings 1d, thereby pushing the solder columns 11 remained in the conveying paths 1c out of the main body section 1. At this, the solder columns 11 fall from the main body section 1 so as to be collected by the solder-collecting section 9.

Thus, according to the apparatus 100 of manufacturing the solder columns as the first embodiment, the main body section 1 contains the insert openings 1d for allowing the solder wires 10 to be inserted and the discharge openings 1e from which the solder wires 10 inserted into the insert openings 1d are discharged. The conveying mechanism (the attaching section 7 and the solder-wire-conveying section 8) conveys the solder wires 10 from the insert openings 1d to the discharge openings 1e. The first cutting blades 4, which are provided near the discharge openings 1e, cut the solder wires 10 discharged from the discharge openings 1e. The second cutting blades 5, which are provided near the insert openings 1d, cut the solder wires 10 inserted into the insert openings 1d.

On the assumption of this, the control section 30 causes the solder wires 10 to be projected from the discharge openings 1e by the attaching section 7 and the solder-wire-conveying section 8, causes the projected solder wires 10 to be cut with the first cutting blades 4 and causes the solder wires 10 inserted into the insert openings 1d to be cut with the second cutting blades 5. For example, by moving the first and second cutting blades 4, 5 at the same time, the solder wires 10 projected from the discharge openings 1e and the solder wires 10 inserted into the insert openings 1d are cut at the same time.

Thus, fixed stress for cutting exerts on a portion of each solder wire 10 to be cut with each first cutting blade 4 and a portion of each solder wire 10 to be cut with each second cutting blade 5 at the same time so that the deformation of the cut surfaces of the corresponding solder wires 10 can be prevented even if the solder wires 10 are composed of the Pb based high-temperature solder. As a result thereof, it is possible to manufacture the solder columns 11 each having a fixed length in the conveying direction thereof because the solder wires 10 can be cut while the deformation of the cut surfaces thereof can be prevented The solder columns 11 also have unchanged cut surfaces so that they have a column shape having a fixed length in the conveying direction, thereby improving shape precision.

It is to be noted that although, in this embodiment, cutting of the solder wires 10 with the first and second cutting blades 4, 5 at the same time has been described, it is not prevented thereto; an end of each solder wire 10 may be cut with each first cutting blade 4 and the other end of each solder wire 10 may be cut with the second cutting blade 5 under the condition where the first cutting blade 4 waits on each discharge opening 1e (each first cutting blade 4 closes each discharge opening 1e). In this case, fixed stress for cutting does not exert on a portion of each solder wire 10 to be cut with each first cutting blade 4 and a portion of each solder wire 10 to be cut with each second cutting blade 5 at the same time, but since each solder wire 10 cut with each second cutting blade 5 is held by each first cutting blade 4 waiting on the discharge opening 1e, it is possible to prevent the cut surfaces of the cut solder wires 10 from being deformed, which can obtain the same effect as that of this embodiment.

Second Embodiment

In this embodiment, the following will describe an apparatus 200 of manufacturing the solder columns by cutting the solder wires with the first, second and third cutting blades with them being curved. Since things having like names and reference characters which refer to like those in the above-mentioned first embodiment have the same functions as those, the description thereof will be omitted.

[Configuration Example of Apparatus of Manufacturing Solder Columns]

Figure 8:
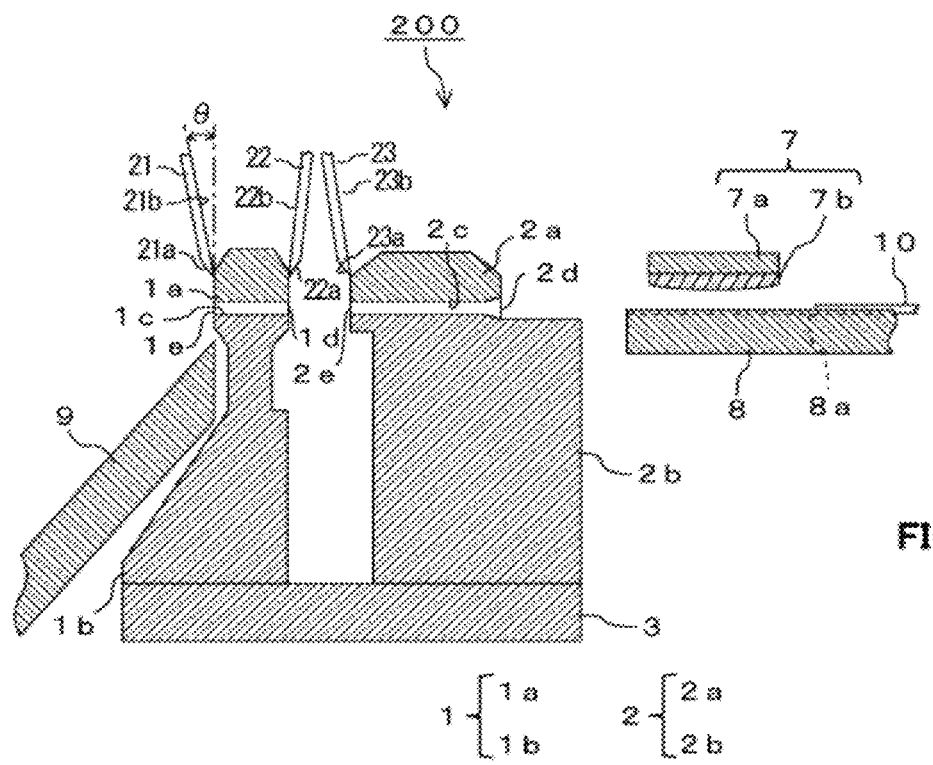
FIG. 8 is a sectional view of an apparatus 200 of manufacturing solder columns as a second embodiment for showing a configuration example thereof.

As shown in FIG. 8, the apparatus 200 of manufacturing the solder columns is constituted of a main body section 1, first cutting blades 21, second cutting blades 22, an attaching section 7 and a solder-wire-conveying section 8. The apparatus 200 of manufacturing the solder columns is also provided with a solder-wire-guiding section 2, a main-body-supporting section 3, third cutting blades 23 and a solder-collecting section 9.

The first, second and third cutting blades 21, 22, 23 have inclined surfaces 21a, 22a, 23a each being inclined in relation to a direction in which each blade extends and parallel surfaces 21b, 22b, 23b each being in parallel with the direction in which each blade extends. As the first through third cutting blades 21, 22, 23, single edge blades each, for example, being made of iron or ceramics are used. A thickness of each of the first through third cutting blades 21, 22, 23 is 0.3 mm through 0.6 mm.

Each first cutting blade 21 is provided so that a rear end (an upper end in FIG. 8) of the corresponding first cutting blade 21 is inclined in a direction away from the discharge opening 1e. An inclined angle θ between the first cutting blade 21 and the discharge opening 1e is preferably 5 through 15 degrees, more preferably 5 through 10 degrees. The inclined angle θ is suitably changeable.

The first cutting blades 21 move toward the main body section 1 with them being inclined by the inclined angle θ. At that, each first cutting blade 21 is done so that a top of the corresponding first cutting blade 21 is in contact against the main body section 1 so as to be curved as a fulcrum of the attached portion.

The first cutting blades 21 cut the solder wires 10 discharged from the discharge openings 1e by moving (sliding) the parallel surfaces 21b of the corresponding first cutting blades 21 with them being curved so as to be in contact against the main body section 1 from tops of the discharge openings 1e to bottoms thereof.

Thus, making the first cutting blades 21 curved enables a clinging performance of the first cutting blades 21 to the main body section 1 to be improved by applying any force toward the discharge openings 1e by the corresponding first cutting blades 21 when cutting the solder wires 10. This causes any space between the first cutting blades 21 and the discharge openings 1e to be not left so that it is further possible to prevent the cut surfaces of the solder wires 10 from being deformed as compared by the above-mentioned apparatus 100 of manufacturing solder columns.

By the way, the larger the inclined angle θ is, the clinging performance of the first cutting blades 21 to the discharge openings 1e is poorer, thereby causing the cut surfaces to be cut obliquely. Therefore, the inclined angle θ is preferably 5 through 15 degrees, as described above.

The second cutting blades 22 are provided so that rear ends (the upper ends in FIG. 8) of the second cutting blades 22 are inclined in a direction away from the insert openings 1d. An angle between the second cutting blades 22 and the insert openings 1d is preferably 5 through 15, more preferably 5 through 10 degrees like the inclined angle θ between the first cutting blades 21 and the discharge openings 1e.

The second cutting blades 22 move toward the main body section 1 with them being inclined by the inclined angle θ. At that, each second cutting blade 22 is done so that a top of the corresponding second cutting blade 22 is in contact against the main body section 1 so as to be curved as a fulcrum of the attached portion.

The second cutting blades 42 move (slide) with them being curved so as to contact the parallel surfaces 22b of the corresponding second cutting blades 22 with the main body section 1 from tops of the insert openings 1d to bottoms thereof and cut the solder wires 10 inserted into the insert openings 1d.

Thus, making the second cutting blades 22 curved enables a clinging performance of the second cutting blades 22 to the main body section 1 to be improved by applying any force toward the insert openings 1d by the corresponding second cutting blades 22. This causes Mews-any space between the second cutting blades 22 and the insert openings 1d to be not left so that it is further possible to prevent the cut surface of each of the solder wires 10 from being deformed as compared by the above-mentioned apparatus 100 of manufacturing solder columns.

The third cutting blades 23 are also provided so that rear ends (upper ends in FIG. 8) of the corresponding third cutting blades 23 are inclined in a direction away from the discharge openings 2e like the first and second cutting blades 21, 22. An angle between the third cutting blades 23 and the discharge openings 2e is preferably 5 through 15 degrees, more preferably 5 through 10 degrees.

The third cutting blades 23 move toward the solder-wire-guiding section 2 with them being inclined by the inclined angle θ. At that, each third cutting blade 23 is done so that a top of the corresponding third cutting blade 23 is in contact against the solder-wire-guiding section 2 so as to be curved as a fulcrum of the attached portion.

The third cutting blades 23 move (slide) with them being curved so as to contact the parallel surfaces 23b of the corresponding third cutting blades 23 with the solder-wire-guiding section 2 from tops of the discharge openings 2e to bottoms thereof and cut the solder wires 10 discharged from the discharge openings 2e.

Thus, making the third cutting blades 23 curved enables a clinging performance of the third cutting blades 23 to the solder-wire-guiding section 2 to be improved by applying any force toward the discharge openings 2e by the corresponding third cutting blades 23 when cutting the solder wires 10. This causes any space between the third cutting blades 23 and the discharge openings 2e to be not left so that it is further possible to prevent the cut surfaces of the solder wires 10 from being deformed as compared by the above-mentioned apparatus 100 of manufacturing solder columns, thereby enabling the solder wires 10 to be easily inserted into the insert openings 1d.

It is to be noted that a configuration example of control system of the apparatus 200 of manufacturing the solder columns is the same as that described in the above-mentioned first embodiment shown in FIG. 4, in which the cutting-blade-driving section 32 drives the first through third cutting blades 21, 22, 23 instead of the first through third cutting blades 4, 5, 6.

[Operation Example of Apparatus 200 of Manufacturing Solder Columns]

Next, the following will describe an operation example of the apparatus 200 of manufacturing the solder columns. It is assumed that from the control section 30, the solder-supplying signal D1 is output to the solder-wire-supplying section 31 and the solder wires 10 are supplied to the grooves 8a, like the apparatus 100 of manufacturing the solder columns, which has been described in the first embodiment.

Figure 9:
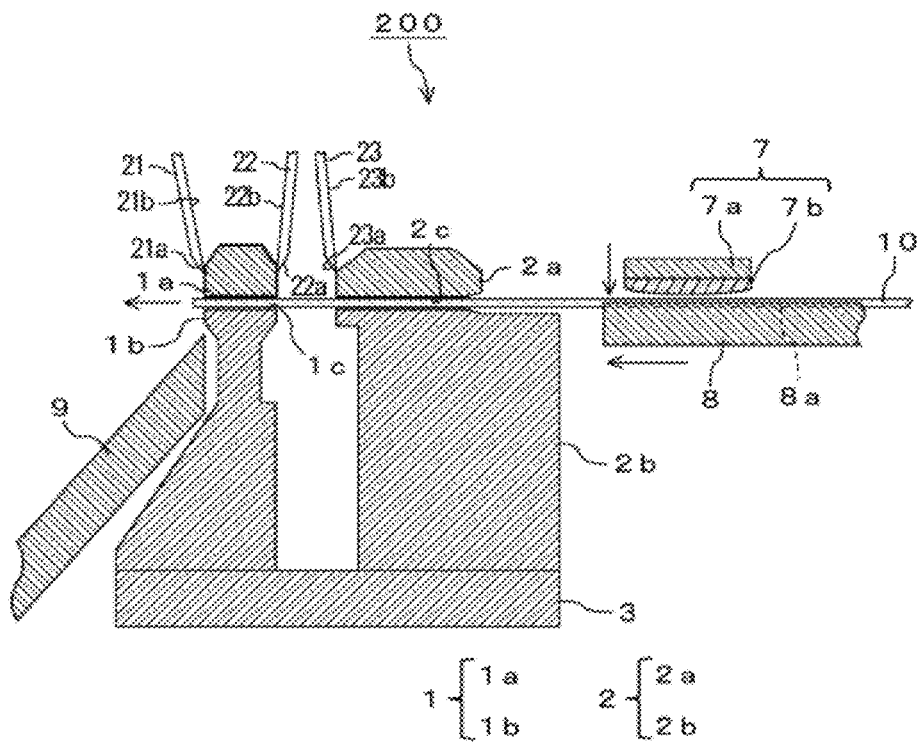
FIG. 9 is a sectional view of the apparatus 200 of manufacturing the solder columns for showing an operation example (part one) thereof.

When the control section 30 shown in FIG. 4 outputs the attaching-section-driving signal D2 to the attaching section 7, the attaching section 7 receives the attaching-section-driving signal D2 and descends to the solder wires 10 mounted on the grooves 8a of the solder-wire-conveying section 8, as shown in FIG. 9, to attach the solder wires 10. When the control section 30 also outputs the solder-conveying signal D3 to the solder-wire-conveying section 8, the solder-wire-conveying section 8 receives the solder-conveying signal D3 and moves by a predetermined distance in a conveying direction of the solder wires 10 (in FIG. 9, it moves to a left side direction) after the attaching section 7 has attached the solder wires 10 so as to be passed through guiding paths 2c and the conveying paths 1c. At that, each solder wire 10 projects by the predetermined length from the discharge opening 1e.

Figure 10:
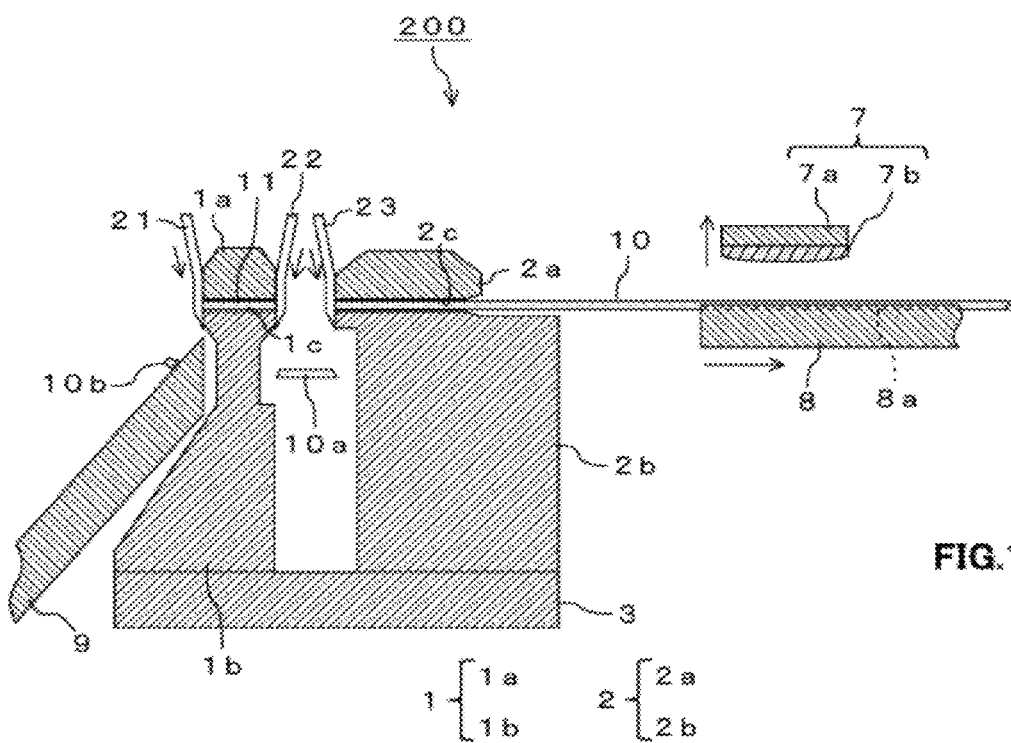
FIG. 10 is a sectional view of the apparatus 200 of manufacturing the solder columns for showing the operation example (part two) thereof.

When projecting the solder wires 10 from the discharge openings 1e by the predetermined length by the attaching section 7 and the solder-wire-conveying section 8 as shown in FIG. 10, the control section 30 outputs the cutting-blade-driving signal D4 to the cutting-blade-driving section 32. The cutting-blade-driving section 32 receives the cutting-blade-driving signal D4 to drive the first through third cutting blades 21, 22, 23, which are connected to the cutting-blade-driving section 32 and are inclined by an inclined angle θ. At this, the first cutting blades 21 move below to the right as an arrow shown in FIG. 10 and are in contact against the main body section 1 so as to be curved. The second cutting blades 22 move below to the left as an arrow shown in FIG. 10 and are in contact against the main body section 1 so as to be curved. The third cutting blades 23 move below to the right as an arrow shown in FIG. 10 and are in contact against the solder-wire-guiding section 2 so as to be curved.

The cutting-blade-driving section 32 then drives the curved first cutting blades 21 still more to cut the solder wires 10 projected from the discharge openings 1e and drives the curved second cutting blades 22 still more to cut the solder wires 10 inserted into the insert openings 1d. The cutting-blade-driving section 32 then drives the curved third cutting blades 23 still more to cut the solder wires 10 discharged from the discharge openings 2e.

In specific terms, by moving the first cutting blades 21 from a position above the discharge openings 1e to a position below them (from the upper mold 1a of the main body section to the lower mold 1b of the main body section) while the parallel surfaces 21b of the curved first cutting blades 21 attach the main body section 1 at a side of the discharge openings 1e, the solder wires 10 projected from the discharge openings 1e by the predetermined length are cut. Concurrently, by moving the second cutting blades 22 from a position above the insert openings 1d to a position below them (from the upper mold 1a of the main body section to the lower mold 1b of the main body section) while the parallel surfaces 22b of the curved second cutting blades 22 attach the main body section 1 at a side of the insert openings 1d, the solder wires 10 inserted into the insert openings 1d are cut. Further, by moving the third cutting blades 23 from a position above the discharge openings 2e to a position below them (from the upper mold 2a of the guiding section to the lower mold 2b of the guiding section) while the parallel surfaces 23b of the curved third cutting blades 23 attach the solder-wire-guiding section 2 at a side of the discharge openings 2e, the solder wires 10 conveyed from the discharge openings 2e are cut.

At that, the solder wires 10, which are projected from the discharge openings 1e, cut with the first cutting blades 21 become cut solder pieces 10b so that they are collected by the solder-collecting section 9. The solder wires 10 cut with the second cutting blades 22 and the third cutting blades 23 become cut solder pieces 10a so that they are collected by a second solder-collecting section, not shown. Within the conveying paths 1c between the insert openings 1d and the discharge openings 1e, the solder columns 11 then remain.

The control section 30 outputs the attaching-section-driving signal D2 and the solder-conveying signal D3 to the attaching section 7 and the solder-wire-conveying section 8 after the solder wires 10 have been cut (after the solder columns 11 have been formed). At that, the attaching section 7 receives the attaching-section-driving signal D2 to ascend and the solder-wire-conveying section 8 receives the solder-conveying signal D3 to move (in FIG. 10, to move to the right side) by a distance to allow the solder wires 10 to be conveyed to the discharge openings 1e (for example, the total sum of a distance between the discharge openings 2e and the insert openings 1d, a distance between the insert openings 1d and the discharge openings 1e and a distance for projecting the solder wires 10 to the discharge openings 1e).

Figure 11:
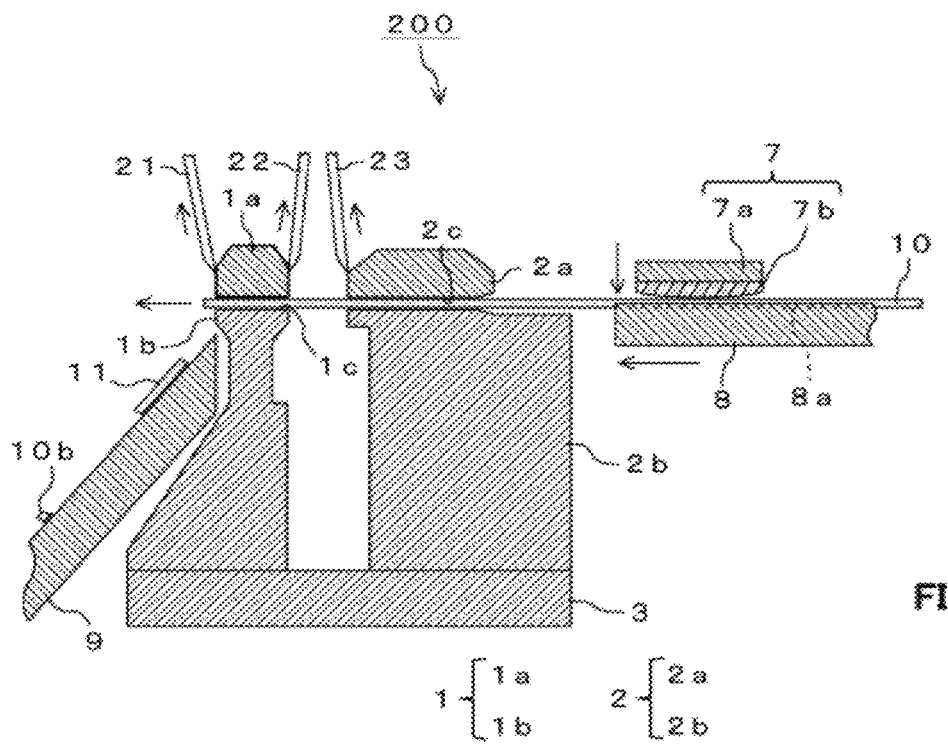
FIG. 11 is a sectional view of the apparatus 200 of manufacturing the solder columns for showing the operation example (part three) thereof.

The control section 30 outputs the cutting-blade-driving signal D4 to the cutting-blade-driving section 32 after the attaching section 7 has ascended and the solder-wire-conveying section 8 has moved to the right side. Thus, as shown in FIG. 11, the cutting-blade-driving section 32 moves the first through third cutting blades 21, 22, 23 above the discharge openings 1e, the insert openings 1d and the discharge openings 2e based on the cutting-blade-driving signal D4 output from the control section 30. This brings about releasing the curves in the first through third cutting blades 21, 22, 23.

The control section 30 then outputs the attaching-section-driving signal D2 and the solder-conveying signal D3 to the attaching section 7 and the solder-wire-conveying section 8. The attaching section 7 receives the attaching-section-driving signal D2 output from the control section 30 to descend to the solder wires 10 mounted on the grooves 8a and to attach the solder wires 10. The solder-wire-conveying section 8 receives the solder-conveying signal D3 output from the control section 30 to move toward the solder-wire-guiding section 2. This movement of the solder-wire-guiding section 2 causes tips of the solder wires 10 cut with the third cutting blades 23 to be inserted into the insert openings 1d, thereby pushing out the solder columns 11 remained in the conveying paths 1c. At this, the solder columns 11 fall from the main body section 1 so as to be collected by the solder-collecting section 9.

Thus, according to the apparatus 200 of manufacturing the solder columns as the second embodiment, the first cutting blades 21 are provided so that the rear ends of the corresponding first cutting blades 21 are inclined in a direction away from the discharge openings 1e. The second cutting blades 22 are provided so that the rear ends of the corresponding second cutting blades 22 are inclined in a direction away from the insert openings 1d.

On the assumption of this, the control section 30 causes the first and second cutting blades 21, 22 to be curved by driving the first and second cutting blades 21, 22 so as to attach the main body section 1. The control section 30 then causes the solder wires 10 projected from the discharge openings 1e to be cut by the curved first cutting blades 21 and causes the solder wires 10 inserted into the insert openings 1d to be cut with the curved second cutting blades 22.

Thus, by applying any force toward the discharge openings 1e by the first cutting blades 21 when cutting the solder wires 10, the first cutting blades 21 and the main body section 1 are closely in contact against each other. Further, by applying any force toward the insert opening 1d by the second cutting blades 22 when cutting the solder wires 10, the second cutting blades 21 and the main body section 1 are closely in contact against each other. As a result thereof, the apparatus 200 of manufacturing the solder columns enables the deformation of the cut surfaces of the solder wires 10 to be further prevented as compared with that of the apparatus 100 of manufacturing the solder columns so that the solder columns 11 become column shapes each having a fixed length in the conveying direction thereof, thereby improving shape precision.

Third Embodiment

In this embodiment, the following will describe an apparatus 300 of manufacturing solder columns by cutting the solder wires with the first, second and third cutting blades with them being inclined. Since things having like names and reference characters which refer to like those in the above-mentioned first and second embodiments have the same functions as those, the description will be omitted.

[Configuration Example of Apparatus 300 of Manufacturing Solder Columns]

Figure 12:
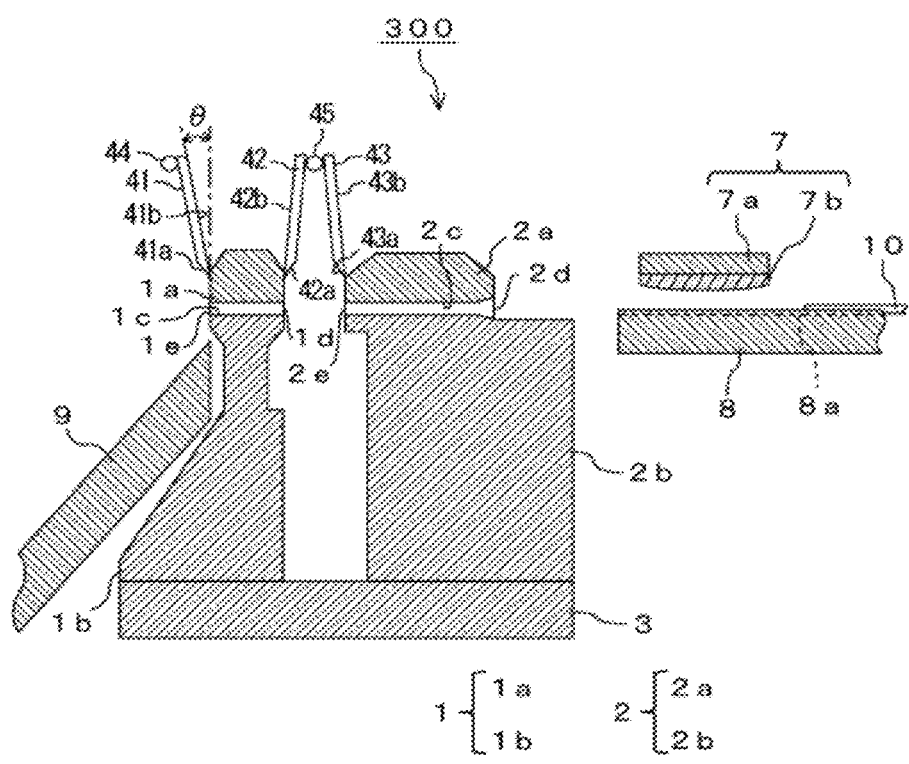
FIG. 12 is a sectional view of an apparatus 300 of manufacturing solder columns as a third embodiment for showing a configuration example thereof.

As shown in FIG. 12, the apparatus 300 of manufacturing the solder columns is constituted of a main body section 1, first cutting blades 41, second cutting blades 42, an attaching section 7 and a solder-wire-conveying section 8. The apparatus 300 of manufacturing the solder columns is also provided with a solder-wire-guiding section 2, a main-body-supporting section 3, third cutting blades 43, a solder-collecting section 9, a first cutting-blade-attaching section 44 and a second cutting-blade-attaching section 45.

The first, second and third cutting blades 41, 42, 43 have inclined surfaces 41a, 42a, 43a each being inclined in relation to a direction in which each blade extends and parallel surfaces 41b, 42b, 43b each being in parallel with the direction in which each blade extends. As the first through third cutting blades 41, 42, 43, single edge blades each, for example, being made of iron or ceramics are used. A thickness of each of the first through third cutting blades 41, 42, 43 is 0.3 mm through 0.6 mm.

Each first cutting blade 41 is provided so that a rear end (an upper end in FIG. 12) of the corresponding first cutting blade 41 is inclined in a direction away from the discharge opening 1e. An inclined angle θ between the first cutting blade 41 and the discharge opening 1e is preferably 5 through 15 degrees, more preferably 5 through 10 degrees. The inclined angle θ is suitably changeable.

The first cutting blades 41 are provided with the first cutting-blade-attaching section 44 at a side of their inclined surfaces 41a. The first cutting-blade-attaching section 44 attaches the first cutting blades 41 to apply force at all time in the opposite direction (the right side direction in FIG. 12) in relation to the conveying direction of the solder wires 10.

The first cutting blades 41 cut the solder wires 10 discharged from the discharge openings 1e by moving (sliding) the corresponding first cutting blades 41 with them being in contact against the first cutting-blade-attaching section 44 so that their tips are in contact against the main body section 1 from tops of the discharge openings 1e to bottoms thereof.

Thus, making the first cutting blades 41 inclined so that the first cutting-blade-attaching section 44 applies the force to the first cutting blades 41 toward the opposite direction in relation to the conveying direction of the solder wires 10 enables a clinging performance of the tips of the first cutting blades 41 to the main body section 1 to be improved by applying any force toward the discharge openings 1e by the corresponding first cutting blades 41 when cutting the solder wires 10. This causes any space between the tips of the first cutting blades 41 and the discharge openings 1e to be not left so that it is possible to prevent the cut surfaces of the solder wires 10 from being deformed as compared by the above-mentioned apparatus 100 of manufacturing solder columns.

By the way, the larger the inclined angle θ is, the clinging performance of the tips of the first cutting blades 41 to the discharge openings 1e is poorer, thereby causing the cut surfaces to be cut obliquely. Therefore, the inclined angle α is preferably 5 through 15 degrees, as described above.

The second cutting blades 42 are provided so that rear ends (the upper ends in FIG. 12) of the second cutting blades 42 are inclined in a direction away from the insert openings 1d. An angle between the second cutting blades 42 and the insert openings 1d is preferably 5 through 15, more preferably 5 through 10 degrees like the inclined angle θ between the first cutting blades 41 and the discharge openings 1e.

The second cutting-blade-attaching section 45 is provided at a side of the inclined surfaces 42a of the second cutting blades 42 and a side of the inclined surfaces 43a of the third cutting blades 43. The second cutting-blade-attaching section 45 attaches the second cutting blades 42 to apply force at all time in the conveying direction (the left side direction in FIG. 12) of the solder wires 10. The second cutting-blade-attaching section 45 also attaches the third cutting blades 43 to apply force at all time in the opposite direction (the right side direction in FIG. 12) in relation to the conveying direction of the solder wires 10.

The second cutting blades 42 move (slide) with them being in contact against the second cutting-blade-attaching section 45 so as to contact the tips of the corresponding second cutting blades 42 with the main body section 1 from tops of the insert openings 1d to bottoms thereof and cut the solder wires 10 inserted into the insert openings 1d.

Thus, making the second blades 42 inclined so that the second cutting-blade-attaching section 45 applies the force to the second cutting blades 42 toward the conveying direction of the solder wires 10 enables a clinging performance of the tips of the second cutting blades 42 to the main body section 1 to be improved by applying any force toward the insert openings 1d by the corresponding second cutting blades 42 when cutting the solder wires 10. This causes any space between the tips of the second cutting blades 42 and the insert openings 1d to be not left so that it is possible to prevent the cut surfaces of the solder wires 10 from being deformed as compared by the above-mentioned apparatus 100 of manufacturing solder columns.

The third cutting blades 43 are also provided so that rear ends (upper ends in FIG. 12) of the corresponding third cutting blades 43 are inclined in a direction away from the discharge openings 2e like the first and second cutting blades 41, 42. An angle between the third cutting blades 43 and the discharge openings 2e is preferably 5 through 15 degrees, more preferably 5 through 10 degrees.

The third cutting blades 43 are moved (slid) with them being in contact against the second cutting-blade-attaching section 45 so as to contact the tips of the corresponding third cutting blades 43 with the solder-wire-guiding section 2 from tops of the discharge openings 2e to bottoms thereof and cut the solder wires 10 discharged from the discharge openings 2e.

Thus, making the third cutting blades 43 inclined so that the second cutting-blade-attaching section 45 applies the force to the third cutting blades 43 toward the opposite direction in relation to the conveying direction of the solder wires 10 enables a clinging performance of the tips of the third cutting blades 43 to the solder-wire-guiding section 2 to be improved when cutting the solder wires 10 by applying any force toward the discharge openings 2e by the corresponding third cutting blades 43. This causes any space between the tips of the third cutting blades 43 and the discharge openings 2e to be not left so that it is further possible to prevent the cut surfaces of the solder wires 10 from being deformed as compared by the above-mentioned apparatus 100 of manufacturing solder columns, thereby enabling the solder wires 10 to be easily inserted into the insert openings 1d.

It is to be noted that a configuration example of control system of the apparatus 300 of manufacturing the solder columns is the same as that described in the above-mentioned first embodiment shown in FIG. 4, in which the cutting-blade-driving section 32 drives the first through third cutting blades 41, 42, 43 instead of the first through third cutting blades 4, 5, 6.

[Operation Example of Apparatus 300 of Manufacturing Solder Columns]

Next, the following will describe an operation example of the apparatus 300 of manufacturing the solder columns. It is assumed that from the control section 30, the solder-supplying signal D1 is output to the solder-wire-supplying section 31 and the solder wires 10 are supplied to the grooves 8a, like the apparatus 100 of manufacturing the solder columns, which has been described in the first embodiment.

Figure 13:
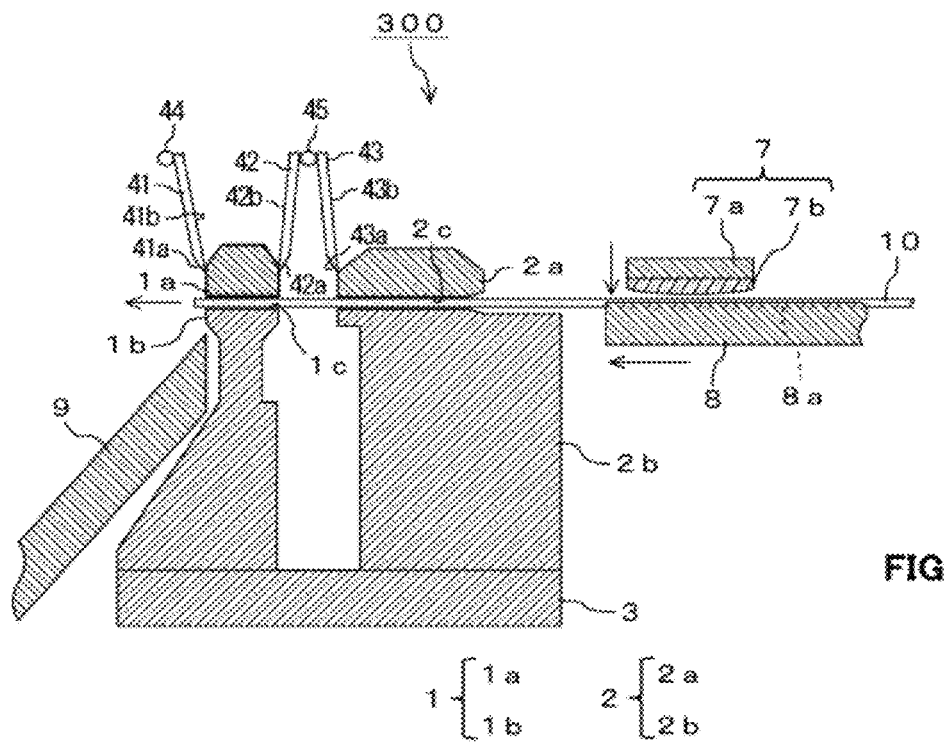
FIG. 13 is a sectional view of the apparatus 300 of manufacturing the solder columns for showing an operation example (part one) thereof.

When the control section 30 shown in FIG. 4 outputs the attaching-section-driving signal D2 to the attaching section 7, the attaching section 7 receives the attaching-section-driving signal D2 and descends to the solder wires 10 mounted on the grooves 8a of the solder-wire-conveying section 8, as shown in FIG. 13, to attach the solder wires 10. When the control section 30 also outputs the solder-conveying signal D3 to the solder-wire-conveying section 8, the solder-wire-conveying section 8 receives the solder-conveying signal D3 and moves by a predetermined distance in a conveying direction of the solder wires 10 (in FIG. 13, it moves to a left side direction) after the attaching section 7 has attached the solder wires 10 so as to be passed through guiding paths 2c and the conveying paths 1c. At that, each solder wire 10 projects by the predetermined length from the discharge opening 1e.

Figure 14:
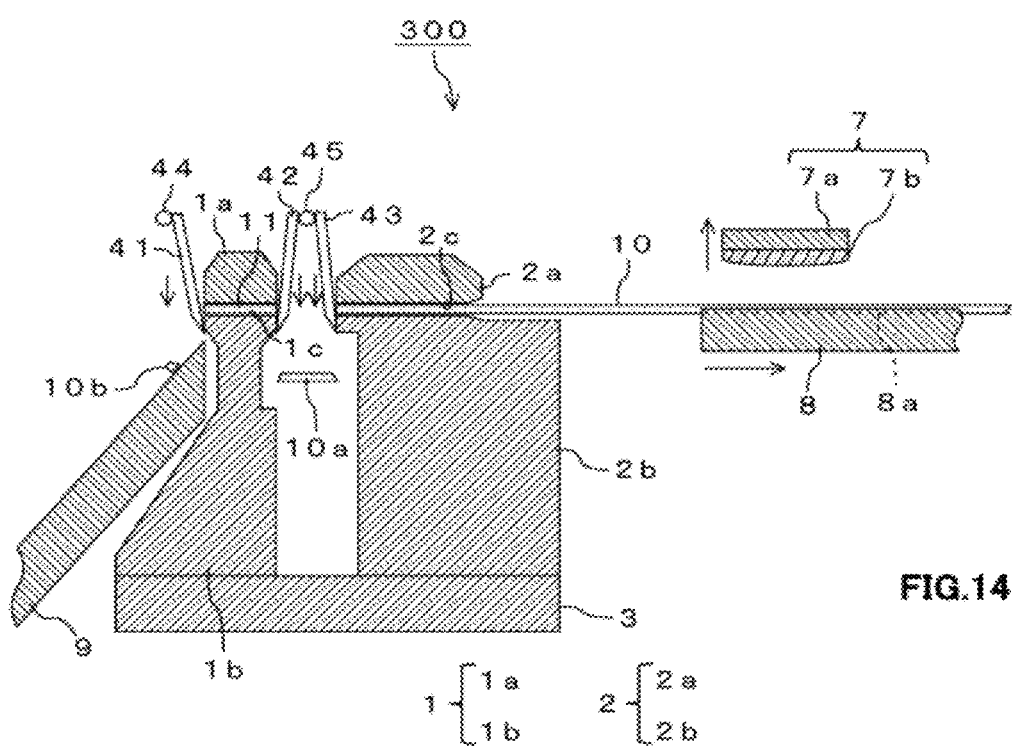
FIG. 14 is a sectional view of the apparatus 300 of manufacturing the solder columns for showing the operation example (part two) thereof.

When projecting the solder wires 10 from the discharge openings 1e by the predetermined length by the attaching section 7 and the solder-wire-conveying section 8 as shown in FIG. 14, the control section 30 outputs the cutting-blade-driving signal D4 to the cutting-blade-driving section 32. At this, the cutting-blade-driving section 32 receives the cutting-blade-driving signal D4 to drive the first cutting blades 41, which are connected to the cutting-blade-driving section 32 and are inclined by an inclined angle θ, to cut the solder wires 10 projected from the discharge openings 1e and to drive the second cutting blades 42, which are connected to the cutting-blade-driving section 32 and are inclined by the inclined angle θ, to cut the solder wires 10 inserted into the insert openings 1d. The cutting-blade-driving section 32 drives the third cutting blades 43, which are connected to the cutting-blade-driving section 32 and are inclined by the inclined angle θ, to cut the solder wires 10 discharged from the discharge openings 2e.

In specific terms, by moving the first cutting blades 41 from a position above the discharge openings 1e to a position below them (from the upper mold 1a of the main body section to the lower mold 1b of the main body section) while the tips of the first cutting blades 41 to which the first cutting-blade-attaching section 44 applies the force in the opposite direction in relation to the conveying direction of the solder wires 10 attach the main body section 1 at a side of the discharge openings 1e, the solder wires 10 projected from the discharge openings 1e by the predetermined length are cut. Concurrently, by moving the second cutting blades 42 from a position above the insert openings 1d to a position below them (from the upper mold 1a of the main body section to the lower mold 1b of the main body section) while the tips of the second cutting blades 42 to which the second cutting-blade-attaching section 45 applies the force in the conveying direction of the solder wires 10 attach the main body section 1 at a side of the insert openings 1d, the solder wires 10 inserted into the insert openings 1d are cut. Further, by moving the third cutting blades 43 from a position above the discharge openings 2e to a position below them (from the upper mold 2a of the guiding section to the lower mold 2b of the guiding section) while the tips of the third cutting blades 43 to which the second cutting-blade-attaching section 45 applies the force in the opposite direction in relation to the conveying direction of the solder wires 10 attach the solder-wire-guiding section 2 at a side of the discharge openings 2e, the solder wires 10 discharged from the discharge openings 2e are cut.

At that, the solder wires 10, which are projected from the discharge openings 1e, cut with the first cutting blades 41 become cut solder pieces 10b so that they are collected by the solder-collecting section 9. The solder wires 10 cut with the second cutting blades 42 and the third cutting blades 43 become cut solder pieces 10a so that they are collected by a second solder-collecting section, not shown. Within the conveying paths 1c between the insert openings 1d and the discharge openings 1e, the solder columns 11 then remain.

The control section 30 outputs the attaching-section-driving signal D2 and the solder-conveying signal D3 to the attaching section 7 and the solder-wire-conveying section 8 after the solder wires 10 have been cut (after the solder columns 11 have been formed). At that, the attaching section 7 receives the attaching-section-driving signal D2 to ascend and the solder-wire-conveying section 8 receives the solder-conveying signal D3 to move (in FIG. 10, to move to the right side) by a distance to allow the solder wires 10 to be conveyed to the discharge openings 1e (for example, the total sum of a distance between the discharge openings 2e and the insert openings 1d, a distance between the insert openings 1d and the discharge openings 1e and a distance for projecting the solder wires 10 to the discharge openings 1e).

Figure 15:
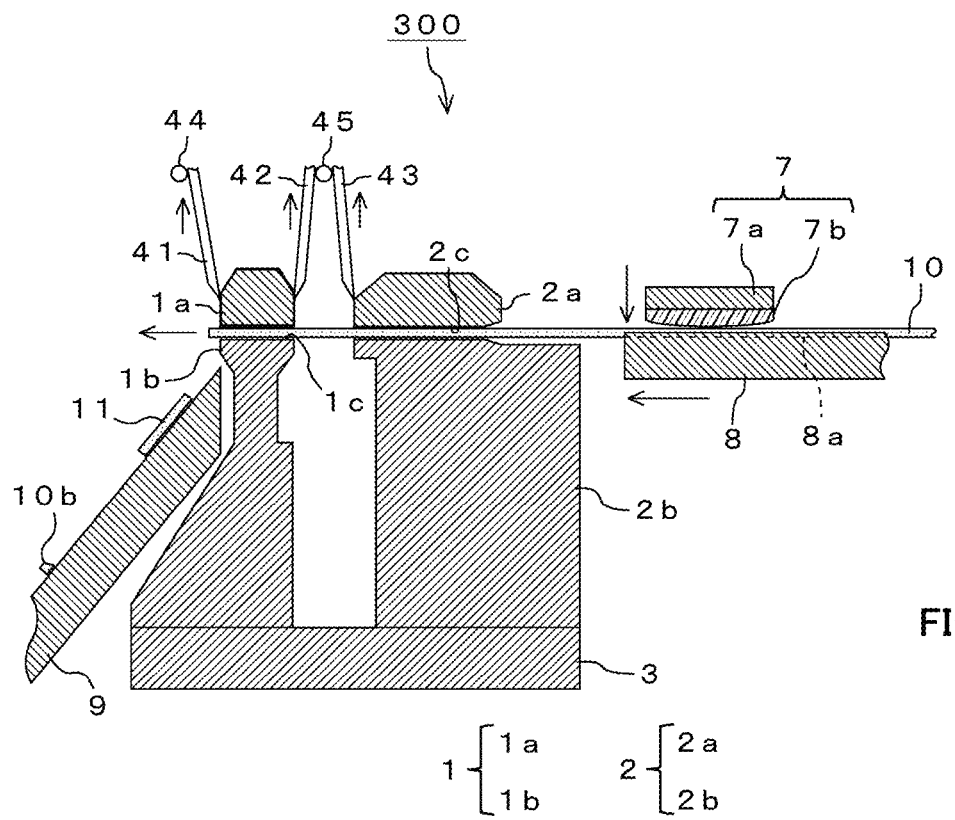
FIG. 15 is a sectional view of the apparatus 300 of manufacturing the solder columns for showing the operation example (part three) thereof.

The control section 30 outputs the cutting-blade-driving signal D4 to the cutting-blade-driving section 32 after the attaching section 7 has ascended and the solder-wire-conveying section 8 has moved to the right side. Thus, as shown in FIG. 15, the cutting-blade-driving section 32 moves the first through third cutting blades 41, 42, 43 above the discharge openings 1e, the insert openings 1d and the discharge openings 2e based on the cutting-blade-driving signal D4 output from the control section 30.

The control section 30 then outputs the attaching-section-driving signal D2 and the solder-conveying signal D3 to the attaching section 7 and the solder-wire-conveying section 8. The attaching section 7 receives the attaching-section-driving signal D2 output from the control section 30 to descend to the solder wires 10 mounted on the grooves 8a and to attach the solder wires 10. The solder-wire-conveying section 8 receives the solder-conveying signal D3 output from the control section 30 to move toward the solder-wire-guiding section 2.

This movement of the solder-wire-conveying section 8 causes tips of the solder wires 10 cut with the third cutting blades 43 to be inserted into the insert openings 1*d*, thereby pushing out the solder columns 11 remained in the conveying paths 1*c*. At this, the solder columns 11 fall from the main body section 1 so as to be collected by the solder-collecting section 9.

Thus, according to the apparatus 300 of manufacturing the solder columns as the third embodiment, the first cutting blades 41 are provided so that the rear ends of the corresponding first cutting blades 41 are inclined in a direction away from the discharge openings 1*e*. The second cutting blades 42 are provided so that the rear ends of the corresponding second cutting blades 42 are inclined in a direction away from the insert openings 1*d*. Further, the first cutting blades 41 are provided with the first cutting-blade-attaching section 44 which attaches the first cutting blades 41 so that any force is applied at all time in opposite direction in relation to the conveying direction of the solder wires 10 by the corresponding first cutting blades 41 and the second cutting blades 42 are provided with the second cutting-blade-attaching section 45 which attaches the second cutting blades 42 so that any force is applied at all time in the conveying direction of the solder wires 10 by the corresponding second cutting blades 42.

On the assumption of this, the control section 30 causes the solder wires 10 projected from the discharge openings 1*e* to be cut with the first cutting blades 41 while the first cutting-blade-attaching section 44 attaches them and causes the solder wires 10 inserted into the insert openings 1*d* to be cut with the second cutting blades 42 while the second cutting-blade-attaching section 45 attaches them.

Thus, by applying any force toward the discharge openings 1*e* by the first cutting blades 41 when cutting the solder wires 10, the tips of the first cutting blades 41 and the main body section 1 are closely in contact against each other. Further, by applying any force toward the insert openings 1*d* by the second cutting blades 42 when cutting the solder wires 10, the tips of the second cutting blades 42 and the main body section 1 are closely in contact against each other. As a result thereof, the apparatus 300 of manufacturing the solder columns enables the deformation of the cut surfaces of the solder wires 10 to be prevented as compared with that of the apparatus 100 of manufacturing the solder columns so that the solder columns 11 become column shapes each having a fixed length in the conveying direction thereof, thereby improving shape precision thereof.

Embodied Example 1

Next, a description will be given of comparison in connection with shapes of the solder columns manufactured by the method of manufacturing them and the solder columns manufactured by the conventional method of manufacturing them and wettability of the solder columns.

Side surfaces and cut surfaces of the following solder columns (1) through (4) are compared with each other: (1) the solder columns manufactured by the apparatus 200 of manufacturing the solder columns according to the present invention; (2) the solder columns formed by the disk grindstone which is the conventional apparatus of manufacturing the solder columns; (3) the solder columns formed by the disk type rotary blade; and (4) the solder columns formed by the ultrasonic cutter.

(1) One thousand of the solder columns were manufactured using the apparatus 200 of manufacturing the solder columns according to the present invention by cutting solder wires having a diameter of 0.5 mm and being composed of 89.5Pb-10.5Sn (having hardness of Hb 3) so as to have a length of 2.54 mm (a length of each of the conveying paths 1*c* is 2.54 mm). The length of each of the solder columns manufactured by the apparatus 200 of manufacturing the solder columns was also measured and the manufacturing errors thereof were calculated.

(2) One thousand of the solder columns each having a diameter of 0.5 mm and a length of 2.54 mm were manufactured by mounting the disk grindstone on a spindle motor to rotate it at right angles in relation to the solder wires, fixing the solder wires each having the diameter and the composition indicated in (1) with a holding jig and cutting the fixed solder wires. The length of each of the solder columns manufactured by such an apparatus was also measured and the manufacturing errors thereof were calculated.

(3) One thousand of the solder columns each having a diameter of 0.5 mm and a length of 2.54 mm were manufactured by mounting a saw blade which is the disk type rotary blade on a spindle motor to rotate it at right angles in relation to the solder wires, fixing the solder wires each having the diameter and the composition indicated in (1) with a holding jig and cutting the fixed solder wires. The manufacturing errors in the lengths of the solder columns manufactured by such an apparatus were also measured.

(4) One thousand of the solder columns each having a diameter of 0.5 mm and a length of 2.54 mm were manufactured by mounting a cutter of single edge blade on an ultrasonic oscillator, fixing the solder wires each having the diameter and the composition indicated in (1) with a holding jig and cutting the fixed solder wires at right angles in relation to the corresponding solder wires. The manufacturing errors in the lengths of the solder columns manufactured by such an apparatus were also measured.

In this example, the lengths of the solder columns manufactured by the methods of (1) through (4) were measured by a micrometer and the manufacturing errors are distributions of the measured values of the lengths in the solder columns by the micrometer. Measured number N of the samples for these manufacturing errors is 300 (N=300). The manufacturing errors measured in (1) through (4) are indicated in a table 1.

Results in the table 1 are summarized as follows:

(1) The solder columns according to the present invention become almost column shapes, the cut surfaces of which are not deformed and in which any burrs do not occur. Such solder columns can stand on a substrate easily so that they are available for CGA.

(2) The solder columns cut by the disk grindstone are shown so that the cut surfaces thereof are severely deformed (so as not to keep a circle), an edge of any of the cut surfaces is melted and many burrs occur. Such solder columns cannot stand on a substrate so that they are unavailable for CGA. Further, the burrs are dangerous in handling as well as a melted part of the edge of any of the cut surfaces and burred parts are poor in the wettability so that they are short in reliability of soldering.

(3) The solder columns formed by the disk type rotary blade are shown so that the cut surfaces thereof are severely deformed (so as not to keep a circle) and many burrs occur. Such solder columns cannot stand on a substrate so that they are unavailable for CGA. Further, the burrs are dangerous in handling as well as burred parts are poor in the wettability so that they are short in reliability of soldering.

(4) The solder columns formed by the ultrasonic cutter are shown so that the cut surfaces thereof become waved because of ultrasonic vibration and many burrs occur. Such solder columns have many burrs and are unstable in order to stand on a substrate because the cut surfaces are not flat so that they are unavailable for CGA. Further, as described before, the burred parts are poor in the wettability so that they are short in reliability of soldering.

Thus, in the solder columns manufactured by the conventional apparatuses of manufacturing the solder columns, they are partially melted because the parts which the disk grindstone and the rotary blade contact and the part cut by the ultrasonic cutter become a high temperature based on friction heat so that the occurrence of the burrs and the deformation of the cut surfaces are confirmed, by which they fail to form column shapes. They are also dim in the cut surfaces and little process line is formed.

Compared with this, in the solder columns manufactured by the apparatus 200 of manufacturing the solder columns according to the present invention, the occurrence of the burrs and the deformation of the cut surfaces are not confirmed because little friction heat occurs in the parts (cut surfaces) which the cutting blades contact so that they form almost column shapes. The cut surfaces are also flat and glossy and plural one-directional processed lines are formed.

The plurality of one-directional processed lines are formed on the cut surface of each solder column so that stress from outside is dispersed, thereby increasing strength of the solder columns substantially. Further, the plurality of one-directional processed lines exists in each cut surface so that wettability for solder paste is improved. Namely, according to the solder column according to the present invention, the strength thereof is substantially increased and the wettability for the solder paste is improved so that reliability of CGA is improved when it is mounted on the CGA.

Embodied Example 2

The solder columns manufactured by the methods (1) through (4) of the above-mentioned embodied example 1 are measured using meniscograph of a wetting balance test stipulated as JIS Z3198-4 on wetting time (Zero cross time) of each solder column. A composition of solder in a used solder bath is Sn-37Pb. Flux also utilizes standard flux B. Measured number N of the samples for the wetting time is 3 (N=3). The measured results of the wetting time are indicated in the table 1.

The solder columns manufactured by the apparatus of manufacturing the solder columns according to the present invention have column shapes for connecting a ceramic board and a glass epoxy board and are characterized in that plural one-directional processed lines exist in each cut surface. When the plural one-directional processed lines exist in each cut surface, oxide film on places where the processed lines are included becomes thin. In general, in the solder wire, a thickness of the oxide film increases following the temperature rise, but in the solder columns manufactured by the apparatus of manufacturing the solder columns according to the present invention, the friction heat generated when cutting the solder wires is limited, as described above, so that it is possible to prevent temperature on the cutting surface from being increased, thereby causing the oxide film of the cut surfaces to be made thin. Thus, making the oxide film on the cut surfaces thin enables the wettability for the solder paste to be improved. This allows the solder column according to the present invention to increase the strength thereof substantially to improve the wettability for the solder paste so that soldering strength is increased when using it to CGA, thereby improving reliability in CGA.

Further, from a result of meniscograph, it is also found that the solder columns formed by the present invention in which plural one-directional processed lines exist in each cut surface have better wettability than that of the solder columns manufactured by the conventional methods of manufacturing them.

On the other hand, in the solder columns manufactured by the conventional methods of manufacturing the solder columns, as shown in the side views and the sectional views in the Table 1, solder compositions of the cut surfaces are crushed or the cut surfaces are partially melted, which cause the solder columns to fail in the wetting thereof.

Embodied Example 3

Next, the following will describe a comparison on shapes of the solder columns based on the inclined angles (the inclined angles α shown in FIGS. 8 and 12) of the cutting blades in relation to the apparatuses 200, 300 of manufacturing the solder columns according to the present invention.

Using the apparatuses 200, 300 of manufacturing the solder columns according to the second and third embodiments, the solder wires each having a diameter of 0.5 mm and a composition of 89.5Pb-10.5Sn are cut by blades of single edge cutter with them being fixed to each of the angles of 0 degrees, 5 degrees, 15 degrees and 30 degrees. Side view photographs and evaluation results at each angle in the apparatus 200 of manufacturing the solder columns are indicated in Table 2 and side view photographs and evaluation results at each angle in the apparatus 300 of manufacturing the solder columns are indicated in Table 3. Squareness described in Tables 2 and 3 is obtained using a microscope.

As shown in Table 2, in a case where the inclined angle is 0 degrees, burr occurs but the squareness is 0.020 mm or less, which is fine. Namely, any deformation in the cutting surface is not shown and an almost column shape is formed. Such solder columns are available for CGA because they have little variation in height.

In cases where the inclined angles are 5 degrees and 15 degrees, any occurrence of burr and any deformation in the cutting surface are not shown and an almost column shape is formed. Squareness of the solder column formed at the inclined angle of 5 degrees is 0.015 mm or less, which is very little and squareness of the solder column formed at the inclined angle of 15 degrees is 0.038 mm. Such solder columns are available for CGA because they have little variation in height.

In a case where the inclined angle is 30 degrees, any burr does not occur but the squareness is impaired to 0.064 mm. The impaired squareness causes performance of thermal stress absorption by the solder columns to be poor so that they are unavailable for CGA.

As shown in Table 3, in a case where the inclined angle is 0 degrees, a few burrs occur but the squareness is 0.015 mm or less, which is fine. Namely, any deformation in the cutting surface is not shown and an almost column shape is formed. Such solder columns are available for CGA because they have little variation in height.

In cases where the inclined angles are 5 degrees and 15 degrees, any occurrence of burr and any deformation in the cutting surface are not shown and an almost column shape is formed. Squareness of the solder column formed at the inclined angle of 5 degrees is 0.016 mm or less, which is very little and squareness of the solder column formed at the inclined angle of 15 degrees is 0.044 mm. Such solder columns are available for CGA because they have little variation in height.

In a case where the inclined angle is 30 degrees, any burr does not occur but the squareness is impaired to 0.084 mm.

The impaired squareness causes performance of thermal stress absorption by the solder columns to be poor so that they are unavailable for CGA.

Thus, the solder columns manufactured by the apparatus 200, 300 of manufacturing the solder columns may control their burrs in the cut surfaces and their shapes by changing the inclined angle θ of the cutting blades. As described in the second and third embodiments, the inclined angle θ of the cutting blades is preferably 5 through 15 degrees, more preferably 5 through 10 degrees.

Figure 19:
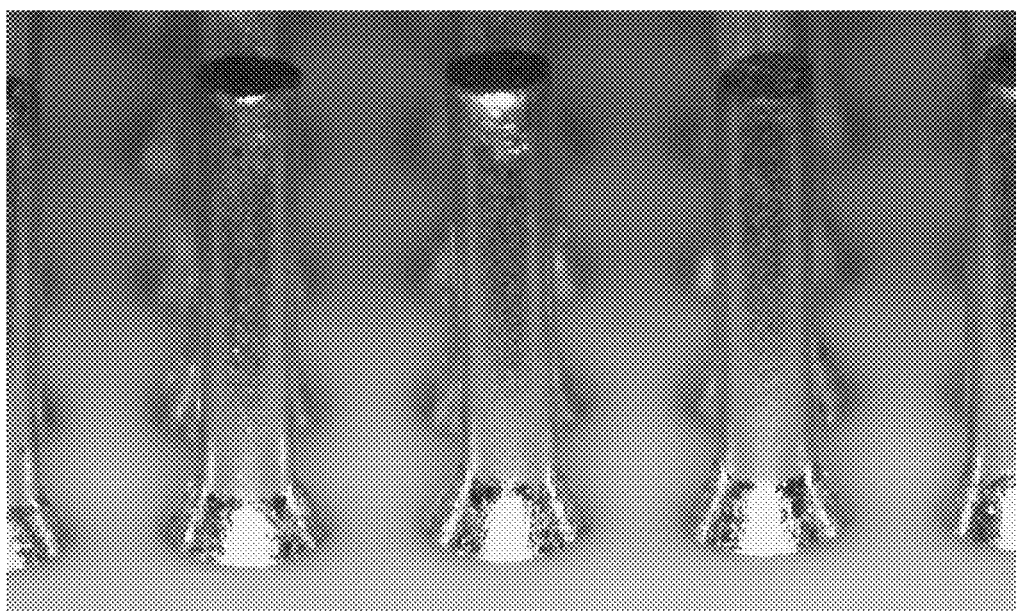
FIG. 19 is a photograph showing CGA mounting the solder columns according to the present invention.
Figure 18:
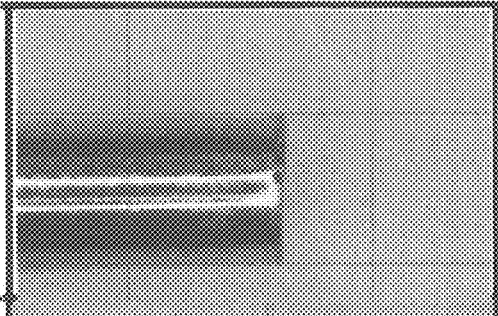
FIG. 18 is a able showing solder columns manufactured by cutting solder wires using blades of single edge cutters fixed at each of four different angles using a second apparatus disclosed herein, including photographs of the resulting solder columns and showing the squareness of each solder column.

FIG. 19 is a photograph showing CGA mounting the solder columns manufactured by the apparatus 200 of manufacturing the solder columns with the inclined angle θ being set so as to be 5 through 10 degrees. CGA shown in FIG. 19 is formed by applying solder paste to the ceramic board, standing the solder columns according to the present invention on the applied portions with any solder column mounting jig or the like and heating them. As described above, the solder columns according to the invention have good wettability for the solder paste so that as shown in FIG. 19, a solder fillet is formed around a bottom of each solder column standing on the ceramic board.

Thus, the solder columns, in each of which plural one-directional processed lines exist in each cut surface, allow an occurrence of any burrs or any melting to be limited when cutting them, have column shapes which are good dimensional tolerance and have good wettability for the solder. Namely, the solder columns according to the present invention are substantially increased in strength and have good wettability for the solder paste so that CGA, reliability of which is high, can be obtained when they are mounted.

It is to be noted that although the solder wires each having a diameter of 0.5 mm has been used in the first through third embodied examples, the invention is not limited thereto; the one having a diameter of 0.2 mm through 0.6 mm may be used.

Further, the length of the solder column is not limited to 2.54 mm but it is possible to form the solder columns each having about 1 mm through 2.54 mm when the conveying paths 1c in the main body section 1 are formed so as to be about 1 mm through 2.54 mm.

Additionally, although the composition of the solder wire is not limited to 89.5Pb-10.5Sn, any Pb based high-temperature solder such as 95Pb-5Sn may be used.

INDUSTRIAL APPLICABILITY

The apparatus of manufacturing the solder columns according to the present invention may be applied to a case where columns made of soft materials such as indium, Cu columns made of copper or the like are manufactured.

DESCRIPTION OF CODES

1 . . . Main body section; 1c . . . Conveying paths; 1d, 2d . . . Insert openings; 1e, 2e . . . discharge openings; 2 . . . Solder-wire-guiding section; 3 . . . Main-body-supporting section; 4, 21, 41 . . . First cutting blades; 5, 22, 42 . . . Second cutting blades; 6, 23, 43 . . . Third cutting blades; 7 . . . Attaching section; 8 . . . Solder-wire-conveying section; 9 . . . Solder-collecting section; 10 . . . Solder wires; 10a, 10b . . . Cut solder pieces; 11 . . . Solder columns; 44 . . . First cutting-blade-attaching section; 45 . . . Second cutting-blade-attaching section; 100, 200, 300 . . . Apparatus of manufacturing solder columns.

The invention claimed is:

1. A method of manufacturing a solder column, the method comprising:
   a first step of conveying a solder wire from an insert opening into a main body section and toward a discharge opening of the main body section, from which the solder wire inserted into the insert opening is discharged and projecting the solder wire from the discharge opening;
   a second step of cutting the solder wire projected from the discharge opening with a first cutting blade and cutting the solder wire inserted into the insert opening with a second cutting blade wherein each of the first and second cutting blades is a single edge blade in which a parallel surface is in parallel with a direction in which each blade extends an inclined surface is at a predetermined angle to the parallel surface, and the inclined surface of the first cutting blade is inclined in an opposite direction to the inclined surface of the second cutting blade, the second step also including sliding the parallel surface of the first cutting blade against the discharge opening and sliding the parallel surface of the second cutting blade against the insert opening and cutting the wire with said parallel surfaces in contact against outer surfaces of the main body section; and
   further comprising a step of cutting an end of the solder wire to be inserted into the insert opening with a third cutting blade; and
   wherein the solder wire is supported between the insert opening and the discharge opening and the solder wire is not supported between the second and third cutting blades.

2. The method of manufacturing a solder column according to claim 1 wherein the first cutting blade is provided so that a rear end of the first cutting blade is inclined in a direction away from the discharge opening; and
   the second cutting blade is provided so that a rear end of the second cutting blade is inclined in a direction away from the insert opening.

3. The method of manufacturing a solder column according to claim 2 wherein an angle between the first cutting blade and the discharge opening and an angle between the second cutting blade and the insert opening are 5 degrees through 15 degrees.

4. The method of manufacturing a solder column according to claim 1 wherein
   the first cutting blade is curved to cut the solder wire projected from the discharge opening, and the second cutting blade is curved to cut the solder wire inserted into the insert opening.

5. The method of manufacturing a solder column according to claim 1 wherein the second step includes applying force to the first cutting blade in a direction which is opposite to a conveying direction of the solder wire to cut the solder wire projected from the discharge opening with the first cutting blade, and applying force to the second cutting blade in the conveying direction of the solder wire to cut the solder wire inserted into the insert opening with the second cutting blade.

6. The method of manufacturing a solder column according to claim 1 wherein the second step includes cutting the solder wire projected from the discharge opening and the solder wire inserted into the insert opening at the same time with the first and second cutting blades.

7. The method of manufacturing a solder column according to claim 1 wherein by conveying the end of the solder wire cut with the third cutting blade from the insert opening toward the discharge opening, the solder column, which has been cut with the first and second cutting blades, and which remained between the insert opening and the discharge opening, is pushed out.

8. The method of manufacturing a solder column according to claim 1 wherein thicknesses of the first through third cutting blades are 0.3 mm through 0.6 mm.

9. The method of manufacturing a solder column according to claim 1, including manufacturing the solder column with a diameter of 0.2 mm through 0.6 mm and a length of 1 mm through 2.54 mm.

10. The method of manufacturing a solder column according to claim 1, including manufacturing the solder column of solder having a composition of 89.5-95% (by mass) Pb and 5-10.5% (by mass) Sn.

11. The method of manufacturing a solder column according to claim 1, including cutting a surface of the solder column to a squareness of 0.015 mm through 0.05 mm.

12. The method of manufacturing a solder column according to claim 1, including cutting parallel processed lines with the first cutting blade and the second cutting blade.

13. An apparatus for performing the method of manufacturing a solder column, comprising:
    a main body section having an insert opening for allowing a solder wire to be inserted and a discharge opening from which the solder wire inserted into the insert opening is discharged;
    a conveying mechanism that conveys the solder wire from the insert opening toward the discharge opening;
    a first cutting blade that cuts the solder wire projecting from the discharge opening, the first cutting blade being provided in position to slide against the discharge opening;
    a second cutting blade that cuts the solder wire inserted into the insert opening, the second cutting blade being provided in position to slide against the insert opening;
    wherein each of the first and second cutting blades is a single edge blade in which a parallel surface is in parallel with a direction in which each blade extends, and an inclined surface is at a predetermined angle to the parallel surface, and the inclined surface of the first cutting blade is inclined in an opposite direction to the inclined surface of the second cutting blade; the parallel surface of the first cutting blade sliding against the discharge opening when cutting the solder wire and the parallel surface of the second cutting blade sliding against the insert opening when cutting the solder wire;
    a third cutting blade that cuts the solder wire to be inserted into the insert opening;
    a controlling portion that causes the solder wire to be projected from the discharge opening by the conveying mechanism, causes the projected solder wire to be cut with the first cutting blade and causes the solder wire inserted into the insert opening to be cut with the second cutting blade and;
    wherein the solder wire is supported between the insert opening and the discharge opening and the solder wire is not supported between the second and third cutting blades.

14. The apparatus of claim 13 wherein the first cutting blade is provided so that a rear end of the first cutting blade is inclined in a direction away from the discharge opening; and
    the second cutting blade is provided so that a rear end of the second cutting blade is inclined in a direction away from the insert opening.

15. The apparatus of claim 14 wherein an angle between the first cutting blade and the discharge opening and an angle between the second cutting blade and the insert opening are within the range of 5 degrees through 15 degrees.

16. The apparatus of claim 13, wherein
    the controlling portion allows the first cutting blade to be in contact against the main body portion and to be curved, thereby sliding the parallel surface of the curved first cutting blade against the discharge opening to cut the solder wire projected from the discharge opening with the first cutting blade, and allows the second cutting blade to be in contact against the main body portion and to be curved, thereby sliding the parallel surface of the curved second cutting blade against the insert opening to cut the solder wire inserted into the insert opening with the second cutting blade.

17. The apparatus of claim 13 wherein the first cutting blade is provided with a first attaching portion to attach the first cutting blade and to apply force thereto in a direction which is opposite to a conveying direction of the solder wire; and
    the second cutting blade is provided with a second attaching portion to attach the second cutting blade and to apply force thereto in the conveying direction of the solder wire.

18. The apparatus of claim 13 wherein the controlling portion cuts the solder wire projected from the discharge opening and the solder wire inserted into the insert opening at the same time with the first and second cutting blades.

19. The apparatus of claim 13 wherein the main body portion is provided with a solder-wire-guiding portion that has a third cutting blade and guides the solder wire to cause the third cutting blade to cut an end of the solder wire to be inserted from the solder-wire-guiding portion into the insert opening.

20. The apparatus of claim 13 wherein the controlling portion allows the conveying mechanism to convey an end of the solder wire cut with the third cutting blade from the insert opening toward the discharge opening and to push out the solder column, which has been cut with the first and second cutting blades, and which remained between the insert opening and the discharge opening.

21. The apparatus of claim 13 wherein thicknesses of the first through third cutting blades are 0.3 mm through 0.6 mm.

* * * * *

UNITED STATES PATENT AND TRADEMARK OFFICE
CERTIFICATE OF CORRECTION

PATENT NO. : 9,283,686 B2
APPLICATION NO. : 13/522947
DATED : March 15, 2016
INVENTOR(S) : Shinichi Nomoto et al.

It is certified that error appears in the above-identified patent and that said Letters Patent is hereby corrected as shown below:

In the Claims

Column 26, line 16, "…each blade extends an inclined" should be -- each blade extends, an inclined --.

Signed and Sealed this
Thirty-first Day of May, 2016

Michelle K. Lee
*Director of the United States Patent and Trademark Office*